United States Patent
Ishikawa

(10) Patent No.: US 6,785,857 B1
(45) Date of Patent: Aug. 31, 2004

(54) FIXED-LOGIC SIGNAL GENERATED IN AN INTEGRATED CIRCUIT FOR TESTING A FUNCTION MACRO INTEGRATED IN AN INTEGRATED CIRCUIT

(75) Inventor: Katsuya Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 774 days.

(21) Appl. No.: 09/641,711

(22) Filed: Aug. 21, 2000

(30) Foreign Application Priority Data

Sep. 10, 1999 (JP) .......................................... 11-257571

(51) Int. Cl.$^7$ ................................................ G06F 11/00
(52) U.S. Cl. ..................................... 714/738; 714/733
(58) Field of Search .............................. 714/724, 733, 714/738, 718; 324/765; 326/40; 365/230.03

(56) References Cited

U.S. PATENT DOCUMENTS

| 4,357,703 A | | 11/1982 | Van Brunt |
| 4,635,261 A | | 1/1987 | Anderson et al. |
| 5,329,533 A | * | 7/1994 | Lin .............................. 714/724 |
| 6,097,206 A | * | 8/2000 | Takano ......................... 324/765 |
| 6,140,840 A | * | 10/2000 | Nakamura ..................... 326/40 |
| 6,424,587 B1 | * | 7/2002 | Hosoda .................. 365/230.03 |

FOREIGN PATENT DOCUMENTS

JP        09-166646        6/1997

* cited by examiner

Primary Examiner—David Ton
(74) Attorney, Agent, or Firm—Arent Fox

(57) ABSTRACT

A fixed-logic signal generated inside an integrated circuit is selectively supplied via selectors (Sm+1 to Sn) to input terminals (INm+1 to INn) of a function macro (1) for receiving signals whose logic levels are fixed to "H" or "L" on at least one test pattern. This eliminates any external input terminal for inputting such fixed-logic signal. When the integrated circuit includes function macros, they can be simultaneously tested with this construction.

37 Claims, 22 Drawing Sheets

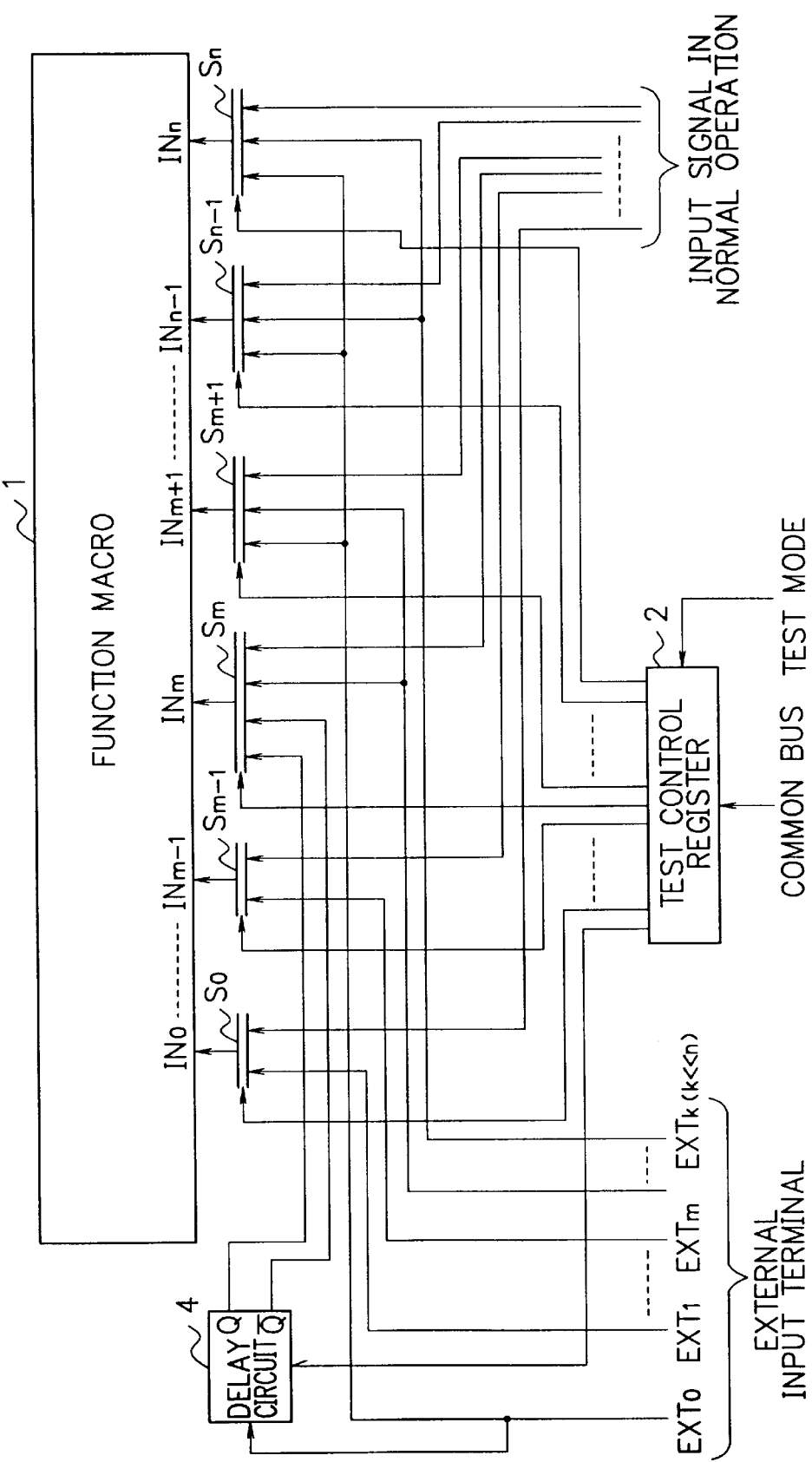

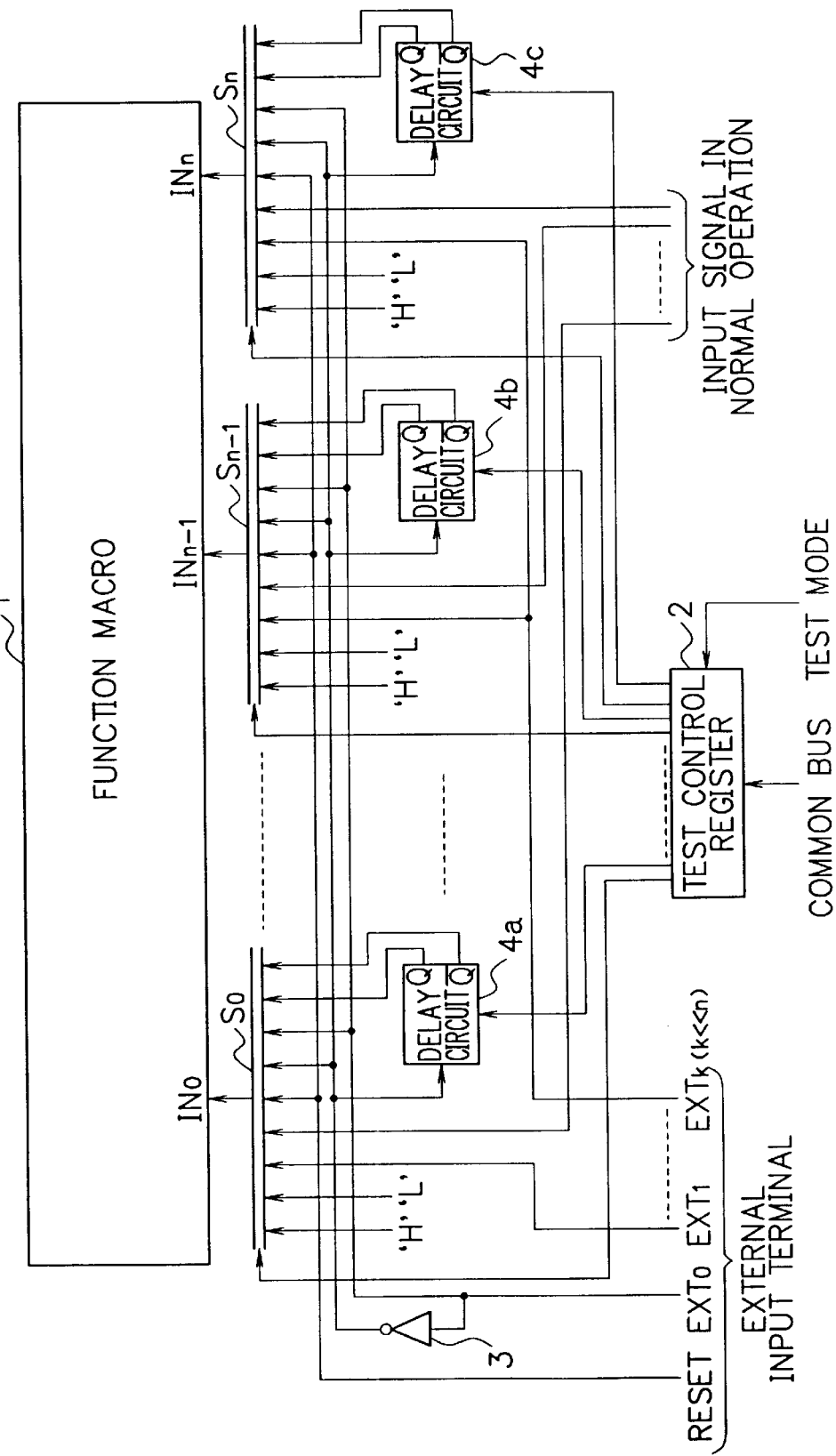

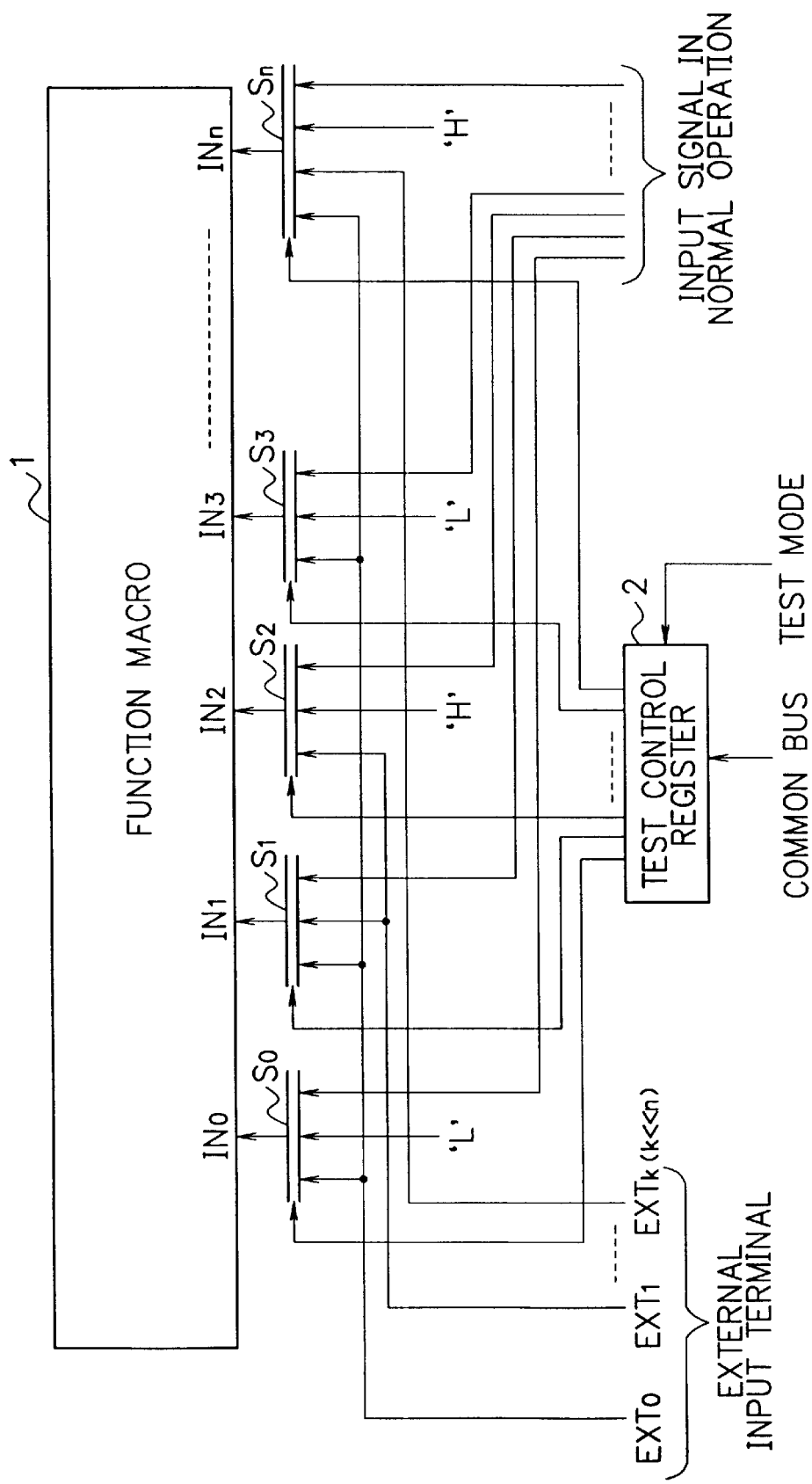

FIXED-LOGIC SIGNAL GENERATED IN AN INTEGRATED CIRCUIT FOR TESTING A FUNCTION MACRO INTEGRATED IN AN INTEGRATED CIRCUIT

BACKGROUND OF THE INVENTION

1. Field of the Invention

The present invention relates to integrated circuit test apparatus, more particularly, to test systems for so-called system LSIs in which a circuit for implementing one function is formed into a macro in a single integrated circuit together with another circuit.

2. Description of the Related Art

Conventionally, circuits of, e.g., a CPU, a DSP, a DRAM, etc., are respectively mounted as independent devices on different boards. In recent years, as such circuits continue to shrink in feature size and increase in density, so-called system LSIs are increasing in which those circuits are formed as macros and integrated as verified function macros in a single integrated circuit together with other circuits. As an increasing trend, one integrated circuit includes two or more function macros.

In many cases, the layout of a function macro which assembles an independent device into a macro is fixed. It is, therefore, difficult to add a test support circuit such as a so-called logic scan circuit into a function macro later. An operation test for a system LSI including a function macro is often done by a function test of externally supplying an instruction or necessary signal, actually running the function macro, and extracting the processing result outside.

FIG. 1 is a circuit diagram showing a conventional fundamental construction for running a function test on a function macro. FIG. 1 shows only the input side of the function macro as a representative. As shown in FIG. 1, a function macro 100 comprises input terminals IN0, IN1, . . . , INn−1, and INn. Selectors S0, S1, . . . , Sn−1, and Sn are so provided as to correspond to the respective input terminals IN0, IN1, . . . , INn−1, and INn.

Each of the selectors S0 to Sn receives two inputs: a signal (instruction or necessary signal for a function test) input from the external input terminal of an integrated circuit including the function macro 100, in function test operation, and a signal input from a circuit of the integrated circuit other than the function macro 100 in normal operation of the integrated circuit. Each selector selects either of the signals, and supplies the selected one to the corresponding one of the input terminals IN0 to INn of the function macro 100. At this time, the selectors S0 to Sn switch the selection states of two inputs in accordance with control signals input to their control terminals.

More specifically, when the control signal represents that a test mode is set, each of the selectors S0 to Sn selects a signal input from the external input terminal of the integrated circuit in function test operation, and supplies the selected signal to the corresponding one of the input terminals IN0 to INn of the function macro 100. When the test mode is not set, i.e., a normal operation mode is set, each of the selectors S0 to Sn selects a signal input from a circuit of the integrated circuit other than the function macro 100, and supplies the selected signal to the corresponding one of the input terminals IN0 to INn of the function macro 100.

In the construction shown in FIG. 1, the terminal definition is changed by the selectors S0 to Sn to connect all the input terminals IN0 to INn of the function macro 100 to the external input terminals of the integrated circuit in test operation so as similarly to run an existing function test for an independent device on the verified function macro 100 integrated in the integrated circuit.

FIG. 2 is a circuit diagram showing a conventional construction when one integrated circuit includes two different function macros. In the construction shown in FIG. 2, one integrated circuit includes two function macros A and B (101 and 102) and another user logic 103, to which necessary signals are supplied from external input terminals 107 of the integrated circuit to run function tests sequentially. The processing results in the function macros 101 and 102 are output from external output terminals 108 of the integrated circuit to obtain the results of the function tests.

For example, function tests are sequentially run on the function macros 101 and 102, and then a function test is run on the user logic 103. In running a function test on the function macro 101, a select signal is supplied from a function macro A select terminal 104 to the function macro 101. In running a function test on the function macro 102, a select signal is supplied from a function macro B select terminal 105 to the function macro 102. In running a function test on the user logic 103, a signal representing a test mode is supplied from a control signal input terminal 106 to the user logic 103.

In running a function test on the function macro 101, signals input from the external input terminals 107 of the integrated circuit are supplied to the function macro 101. At this time, signals input from some of the external input terminals 107 are supplied to the function macro 101 via selectors 109 each for selectively outputting either of the input signal and a signal processed by the user logic 103. The processing results in the function macro 101 are output outside from the external output terminals 108 of the integrated circuit via selectors 111 each for selectively outputting any of a signal processed by the function macro 101, a signal processed by the function macro 102, and an output signal in normal operation.

In running a function test on the function macro 102, signals input from the external input terminals 107 of the integrated circuit are supplied to the function macro 102. At this time, signals input from some of the external input terminals 107 are supplied to the function macro 102 via selectors 110 each for selectively outputting either of the input signal and a signal processed by the user logic 103. The processing results in the function macro 102 are output outside from the external output terminals 108 of the integrated circuit via the selectors 111. Note that the external output terminals 108 include a dedicated terminal for outputting only a signal processed by, e.g., the function macro 102.

In running a function test on the user logic 103, signals input from the external input terminals 107 of the integrated circuit are supplied to the user logic 103. Signals processed by the user logic 103 are supplied to the function macros 101 and 102 via the selectors 109 and 1lzerothe processing results in the function macros 101 and 102 are output outside from the external output terminals 108 of the integrated circuit with or without the mediacy of the selectors 111.

In this construction, external terminals of the integrated circuit connected to only the function macros 101 and 102 are test terminals.

As shown in FIG. 1, an integrated circuit such as a conventional system LSI must be equipped with test terminals (external input terminals) for externally supplying various test signals to the input terminals of a function macro in order to run an existing function test even on a function macro integrated in the integrated circuit. This also applies to output terminals for outputting processing results in a function macro. For this purpose, a large number of external test terminals not used in normal operation must be provided on an integrated circuit, resulting in a highly costly integrated circuit.

As shown in FIG. 2, in an integrated circuit including function macros, the input/output terminals of function macros to be tested are selectively connected to the external test terminals of the integrated circuit to run function tests on the function macros sequentially. This prolongs the time required to test all the function macros.

As a means for preventing an increase in test time, as shown in FIG. 3, function tests are simultaneously run on two function macros 101 and 102 by simultaneously supplying a select signal for selecting function macros from a macro select terminal 112 to the function macros 101 and 102.

In this construction, however, all the input/output terminals of the function macros 101 and 102 must be connected to the external test terminals of the integrated circuit in test operation, to say the least. Thus the number of external test terminals of the integrated circuit must be increased. Such an increase in the number of test terminals greatly increases the cost.

SUMMARY OF THE INVENTION

It is an object of the present invention to suppress an increase in the number of external test terminals of an integrated circuit and reduce the cost.

It is another object of the present invention to suppress an increase in the number of external test terminals and reduce the cost in a test for an integrated circuit including function macros, and shorten the test time by simultaneously testing the function macros.

To achieve the above objects, according to the present invention, an integrated circuit test apparatus for testing a function macro integrated in an integrated circuit comprises a signal generation circuit for generating a fixed-logic signal on at least one test pattern, or a signal having a specific relationship with a signal input from a specific external input terminal of the integrated circuit, and a selection circuit for selectively supplying the signal generated by the signal generation circuit to an input terminal of the function macro.

This construction allows generating, inside the integrated circuit, a fixed-logic signal or a signal having a specific relationship with one signal input from the specific external input terminal of the integrated circuit. The integrated circuit does not require any external input terminal for inputting such signal.

For example, according to one aspect of the present invention, a fixed-logic signal generated inside the integrated circuit is selectively supplied to an input terminal of the function macro for receiving a fixed-logic signal on at least one test pattern.

This construction allows generating, inside the integrated circuit, a fixed-logic signal used to test a function macro. No fixed-logic signal need be input from the external input terminal of the integrated circuit.

According to another aspect of the present invention, an external input terminal of the integrated circuit for receiving a variable-logic signal is shared by input terminals of the function macro including terminals which do not simultaneously use one external input terminal as far as a signal input from the external input terminal is not simultaneously used by at least two input terminals of the function macro.

This construction allows appropriately supplying signals corresponding to each test pattern from one shared external input terminal to input terminals of the function macro.

According to still another aspect of the present invention, a signal input from a specific external input terminal of the integrated circuit is selectively supplied to input terminals of the function macro for receiving signals of the same logic level on at least one test pattern.

This construction allows supplying the same signal from one shared external input terminal to input terminals of the function macro.

According to still another aspect of the present invention, to an input terminal of the function macro for receiving a signal opposite in logic level to one signal on at least one test pattern, the opposite logic signal is generated from the one signal inside the integrated circuit, and selectively supplied.

This construction allows supplying one signal and an opposite logic signal from one external input terminal to input terminals of the function macro.

According to still another aspect of the present invention, to an input terminal of the function macro for receiving a signal delayed from one signal by a predetermined amount or an opposite logic signal on at least one test pattern, the signal delayed by the predetermined amount or the opposite logic signal is generated from the one signal inside the integrated circuit, and selectively supplied.

In this case, leading and trailing edge delay amounts for the one signal input from a specific external input terminal may be independently set.

This construction allows supplying one signal and a signal delayed from the one signal by a predetermined amount or an opposite logic signal from one external input terminal to input terminals of the function macro. Further, a signal whose leading and trailing edge delay amounts are different can be supplied as the signal delayed from the one signal by a predetermined amount.

According to still another aspect of the present invention, a selection state of a signal input to the input terminal of the function macro is controlled in accordance with control information set in a register in each of the above-described constructions. In this case, the control information may be set in the register via a common bus also connected to the function macro.

With this construction, the integrated circuit does not require any special external terminal for controlling the selection state of a signal input to the input terminal of the function macro.

According to the present invention, an integrated circuit test apparatus for testing a function macro integrated in an integrated circuit comprises an internal determination circuit for comparing a signal output from an output terminal of the function macro with, as an expectation signal of a test, a fixed-logic signal or a signal having a specific relationship with a signal input from a specific external input terminal of the integrated circuit to determine a test result for each signal output from at least one output terminal of the function macro, summing up determination results, and selectively supplying the summed result to a specific external output terminal of the integrated circuit.

In this construction, even if the function macro has many output terminals for outputting test results, test results output from the output terminals are determined inside the integrated circuit and output from a specific external output terminal. The integrated circuit does not require many external output terminals for outputting test results obtained from the output terminals of the function macro to outside the integrated circuit.

For example, according to one aspect of the present invention, a test result is determined for each signal output from at least one output terminal of the function macro by comparing a fixed-logic signal output from an output terminal of the function macro on at least one test pattern with a fixed-logic expectation signal generated inside the integrated circuit, and determination results are summed up and selectively supplied to a specific external output terminal of the integrated circuit.

In this construction, even if the function macro has many output terminals for outputting test results, test results output from the output terminals can be determined inside the integrated circuit and output from a specific external output terminal. Since a fixed-logic expectation signal to be compared is generated inside the integrated circuit, no fixed-logic signal need be input from the external input terminal of the integrated circuit.

According to another aspect of the present invention, an external output terminal of the integrated circuit except for the specific external output terminal is shared by output terminals of the function macro as far as signals output from the output terminals of the function macro are not simultaneously used by one external output terminal.

This construction allows appropriately supplying test result signals corresponding to each test pattern from output terminals of the function macro to one shared external output terminal.

According to still another aspect of the present invention, a test result is determined for each signal output from at least one output terminal of the function macro by comparing signals of the same logic level output from output terminals of the function macro on at least one test pattern with an expectation signal input from a specific external input terminal of the integrated circuit, and determination results are summed up and selectively supplied to a specific external output terminal of the integrated circuit.

In this construction, even if the function macro has many output terminals for outputting test results, test results output from the output terminals can be determined inside the integrated circuit and output from a specific external output terminal. An expectation signal to be compared with a signal output from at least one output terminal of the function macro is commonly input from a specific external input terminal. The integrated circuit does not require many external input terminals for inputting expectation signals of the same logic level.

According to still another aspect of the present invention, an expectation signal opposite in logic level to one expectation signal on at least one test pattern is generated from the one expectation signal inside the integrated circuit, a test result is determined for each signal output from at least one output terminal of the function macro by comparing a signal output from an output terminal of the function macro with the one expectation signal and the expectation signal opposite in logic level to the one expectation signal, and determination results are summed up and selectively supplied to a specific external output terminal of the integrated circuit.

In this construction, even if the function macro has many output terminals for outputting test results, test results output from the output terminals can be determined inside the integrated circuit and output from a specific external output terminal. An expectation signal of opposite logic is generated inside the integrated circuit from an expectation signal input from a specific external input terminal. Thus, the integrated circuit does not require many external input terminals for inputting expectation signals of opposite logic levels.

According to the still another aspect of the present invention, the one expectation signal is a signal which is identical to a reset signal or opposite in logic level to the reset signal.

In this construction, a terminal for inputting an expectation signal serves as a reset terminal.

According to still another aspect of the present invention, an expectation signal delayed from one expectation signal by a predetermined amount or an expectation signal of opposite logic on at least one test pattern is generated from the one expectation signal inside the integrated circuit, a test result is determined for each signal output from at least one output terminal of the function macro by comparing a signal output from an output terminal of the function macro with the one expectation signal and the expectation signal delayed from the one expectation signal by a predetermined amount or the expectation signal of opposite logic, and determination results are summed up and selectively supplied to a specific external output terminal of the integrated circuit.

In this case, leading and trailing edge delay amounts for the one expectation signal input from the specific external output terminal may be independently set.

In this construction, even if the function macro has many output terminals for outputting test results, test results output from the output terminals can be determined inside the integrated circuit and output from a specific external output terminal. An expectation signal delayed by a predetermined amount from an expectation signal input from a specific external input terminal, or an expectation signal of opposite logic is generated inside the integrated circuit. The integrated circuit does not require many external input terminals for inputting one expectation signal and an expectation signal delayed by a predetermined amount. As the signal delayed from the one expectation signal by a predetermined amount, a signal whose leading and trailing edge delay amounts are different can be generated inside the integrated circuit.

According to still another aspect of the present invention, determination of the test result for each signal output from the output terminal of the function macro is controlled in accordance with control information set in a register. In this case, the control information may be set in the register via a common bus also connected to the function macro.

In this construction, a special external terminal for controlling a test result in the function macro need not be formed on the integrated circuit.

As described above, according to the present invention, a signal which can be generated inside an integrated circuit is internally generated and supplied to the input terminal of the function macro on the input side of a function macro integrated in the integrated circuit. A signal which can be commonly used by input terminals is input from one external input terminal. The number of external input terminals of the integrated circuit necessary for test operation of the function macro can be reduced to reduce the cost.

A test result output from each output terminal of the function macro is determined inside the integrated circuit on the output side of the function macro integrated in the integrated circuit. A signal obtained from the determination result is output from a specific external output terminal. The number of external output terminals of the integrated circuit necessary for test operation of the function macro can be reduced to reduce the cost.

When one integrated circuit includes function macros, the input/output sides of the function macros are constituted in the above-mentioned manner and these function macros are simultaneously tested. Function macros can be tested within a short time, while the number of external terminals used in a test is suppressed small.

BRIEF DESCRIPTION OF THE DRAWINGS

FIG. 11 is a circuit diagram showing a fundamental construction of the fourth embodiment of the present invention for running a function test on a function macro;

FIG. 13 is a circuit diagram showing a fundamental construction of the fifth embodiment of the present invention for running a function test on a function macro;

FIG. 14 is a circuit diagram showing a fundamental construction of the sixth embodiment of the present invention for running a function test on a function macro;

DETAILED DESCRIPTION OF THE PREFERRED EMBODIMENTS

Preferred embodiments of the present invention will be described below with reference to drawings.

A verified function macro, particularly, a processor core used in an integrated circuit such as a system LSI, processes many signals such as operation mode signals, interrupt signals, and error signals. A function test on a function macro is run by inputting several test pattern signals divided in units of functions. These signals have a property that a certain input signal is fixed or common with another input signal, or a certain output signal is fixed or common with another output signal on most test patterns.

For example, when a function test is run with a specific test pattern, the logic level of a test signal input to an interrupt signal terminal changes with time elapsing, but the logic level of a test signal input to an error signal terminal is fixed.

In the following embodiments, the number of external terminals necessary for a function test is reduced by devising input/output of terminal information in consideration of this property.

First Embodiment

Figure 1:
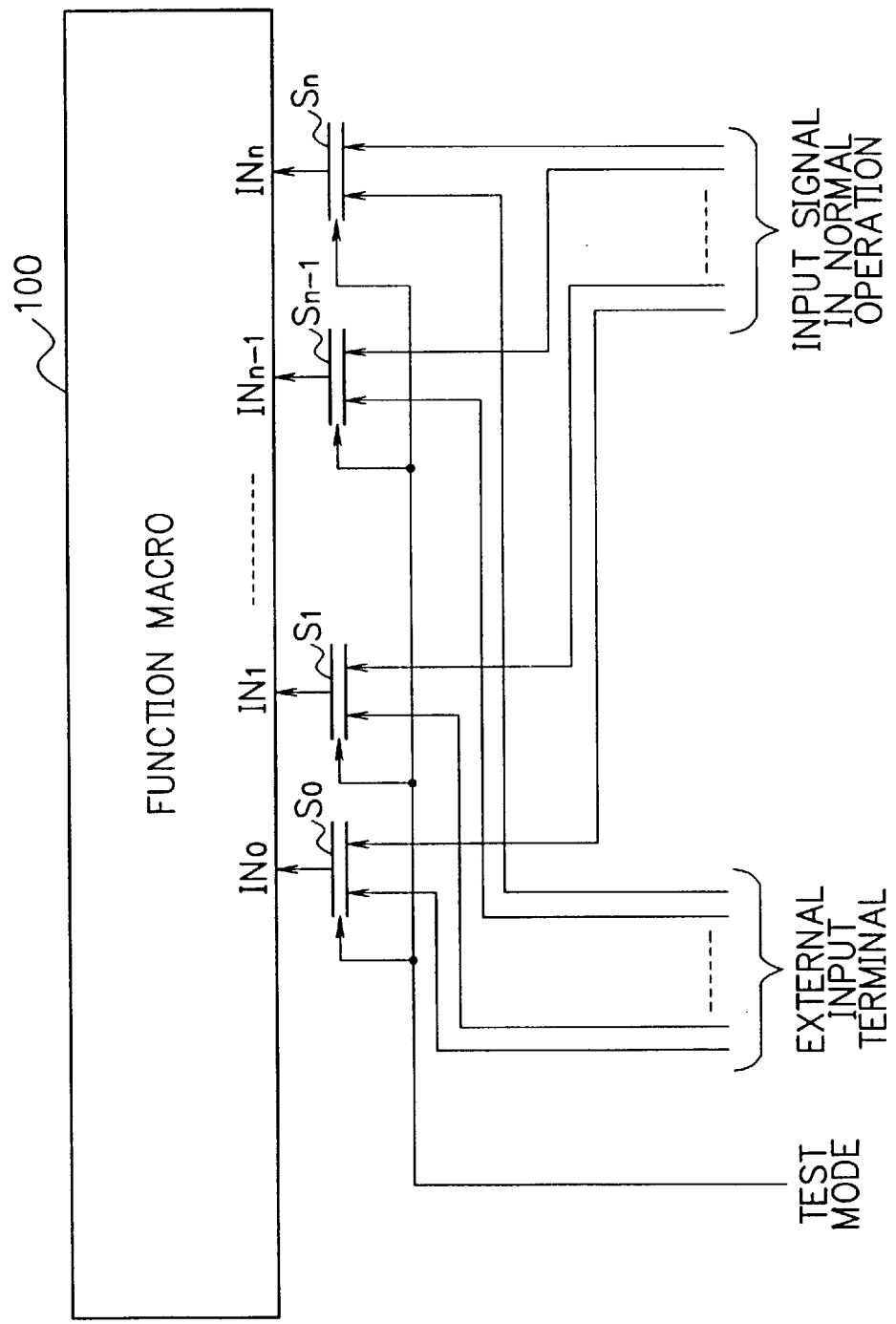
FIG. 1 is a circuit diagram showing a conventional fundamental construction for running a function test on a function macro.
Figure 2:
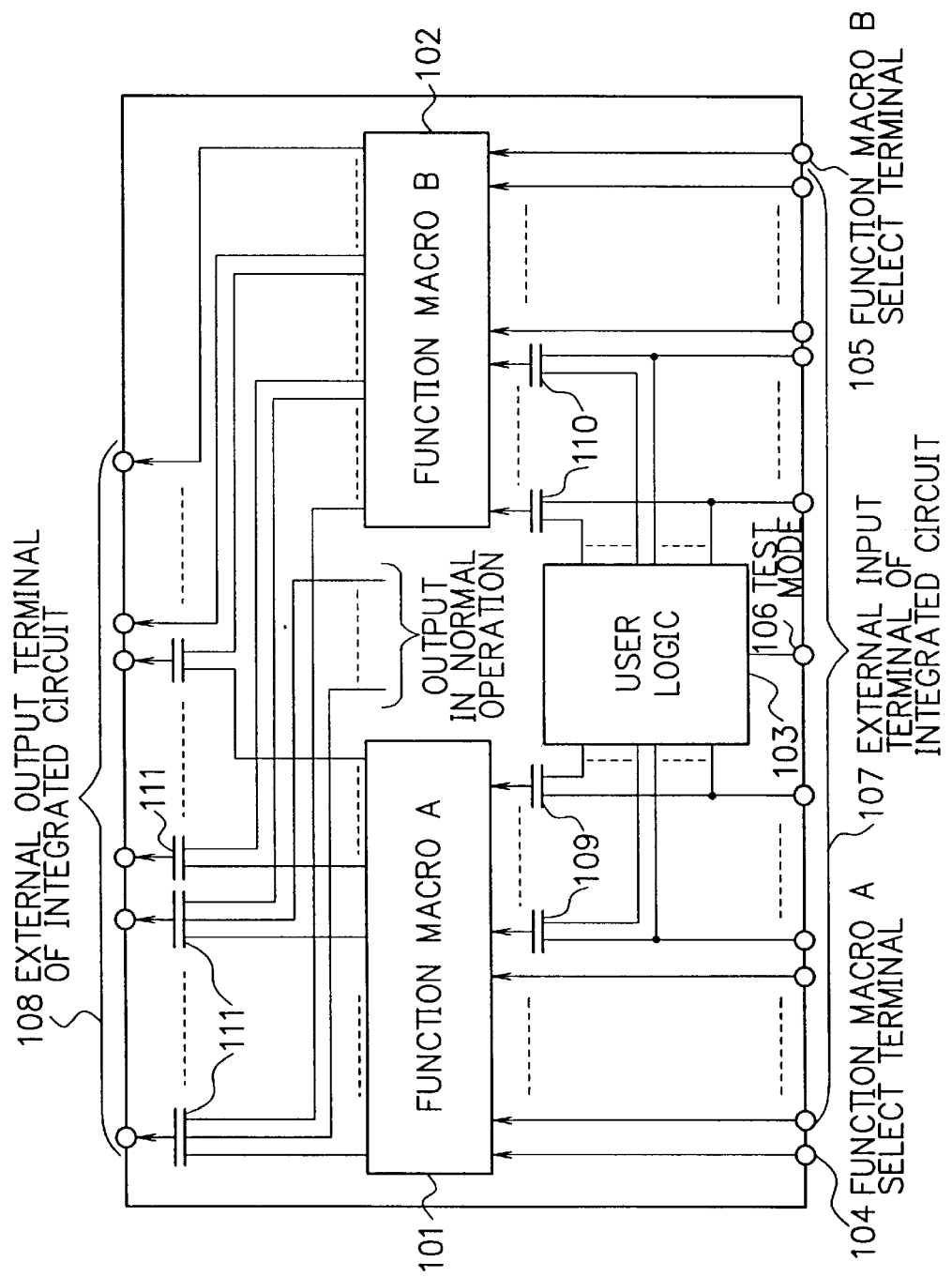
FIG. 2 is a circuit diagram showing a conventional construction when one integrated circuit includes two different function macros.
Figure 3:
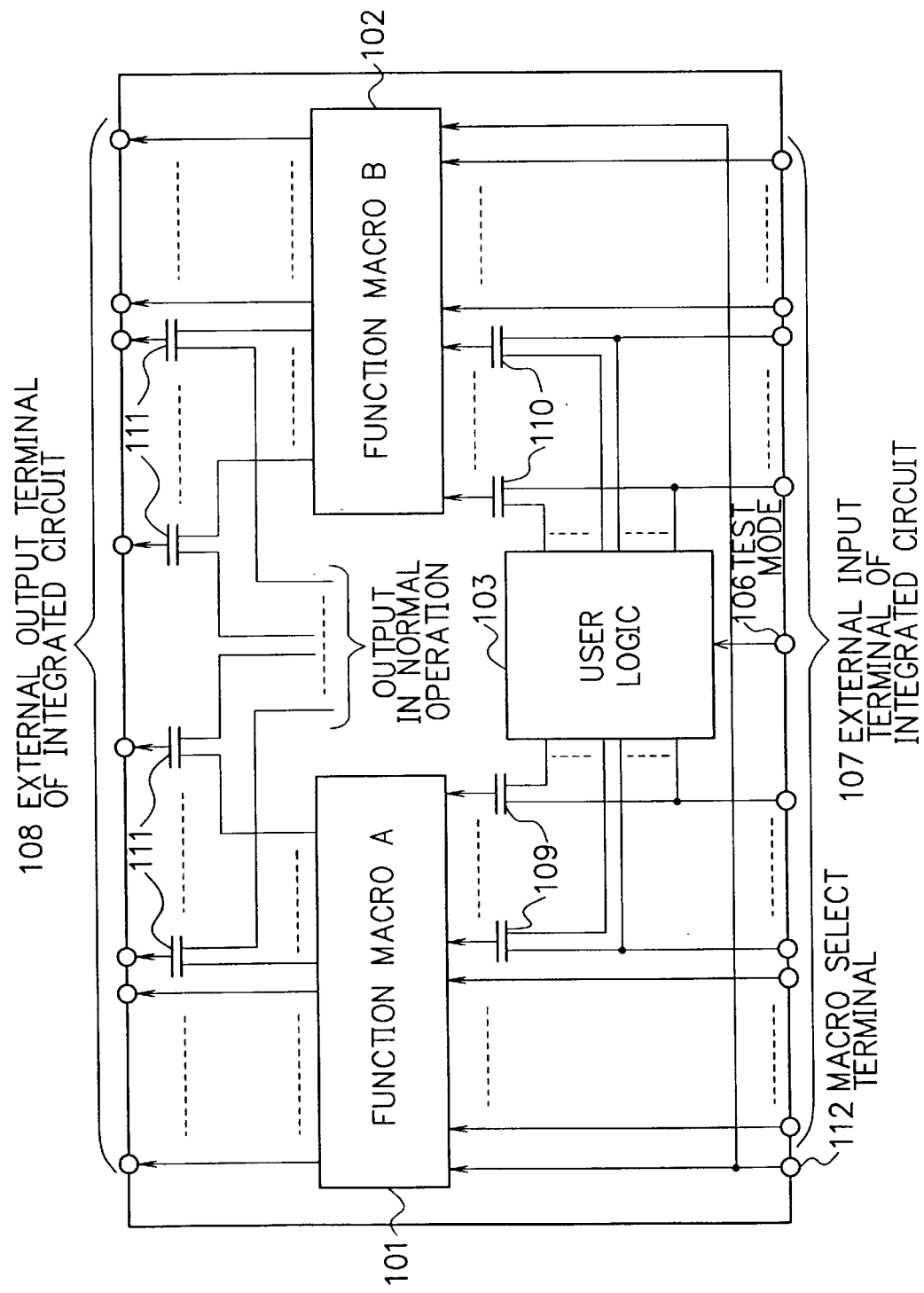
FIG. 3 is a circuit diagram showing another conventional construction when one integrated circuit includes two different function macros.
Figure 4:
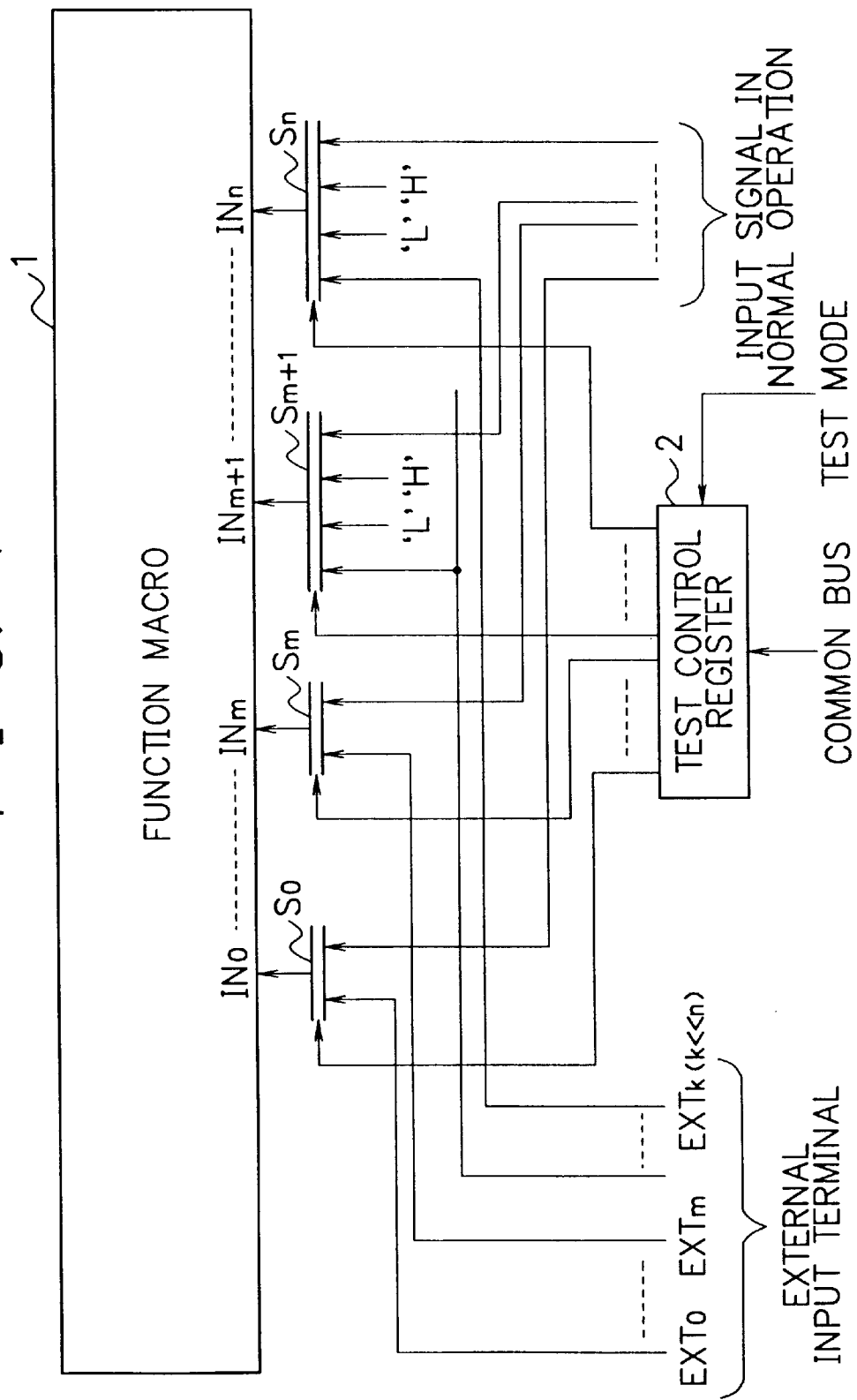
FIG. 4 is a circuit diagram showing a fundamental construction of the first embodiment of the present invention for running a function test on a function macro.

FIG. 4 is a circuit diagram showing a fundamental construction of the first embodiment of the present invention for running a function test on a function macro. As shown in FIG. 4, a function macro 1 comprises input terminals IN0, . . . , INm, INm+1, . . . , INn. Selectors S0, . . . , Sm, Sm+1, . . . , Sn are so provided as to correspond the respective input terminals IN0, . . . , INm, INm+1, . . . , INn.

Of these input terminals IN0 to INn, the zeroth to m-th input terminals IN0 to INm input signals whose values are not fixed to "H" or "L" (logic levels change to "H" or "L" with time elapsing) on all test patterns. Each of the selectors S0 to Sm corresponding to the input terminals IN0 to INm receives two inputs: a signal (instruction or necessary signal for a function test) which is input from the corresponding one of external input terminals EXT0 to EXTm of an integrated circuit in function test operation and changes in logic level, and a signal input from a circuit of the integrated circuit other than the function macro 1 in normal operation. Each or the selectors S0 to Sm selects either of the signals, and supplies the selected one to the corresponding one of the input terminals IN0 to INm of the function macro 1.

The (m+1)th to n-th input terminals INm+1 to INn of the function macro 1 input signals whose values are fixed to "H" or "L" on at least one test pattern the selectors Sm+1 to Sn corresponding to the input terminals INm+1 to INn receive logic variable signals input from external input terminals EXTm+1 to EXTk (k<n) of the integrated circuit in function test operation, signals input from a circuit other than the function macro 1 in normal operation, and "H" or "L" fixed-logic signals. The selectors Sm+1 to Sn select any of these signals, and supply the selected signals to the input terminals INm+1 to INn of the function macro 1.

Of the external input terminals EXT0 to EXTk, the external input terminals EXTm+1 to EXTk connected to the selectors Sm+1 to Sn provided to correspond to the respective input terminals INm+1 to INn whose input signals can be fixed are shared by input terminals of the function macro 1 including terminals which do not simultaneously use one external input terminal as far as a test pattern signal input from the external input terminal is simultaneously used by two or more input terminals of the function macro 1.

The selectors S0 to Sn switch input selection states in accordance with pieces of control information input from a test control register 2 to the control terminals of the selectors S0 to Sn in setting a test mode. Before a test mode is set, these pieces of control information for controlling the selection states of the selectors S0 to Sn in units of functions (test patterns) of a function test are stored in the test control register 2 via the common bus of the integrated circuit also connected to the function macro 1.

Figure 5:
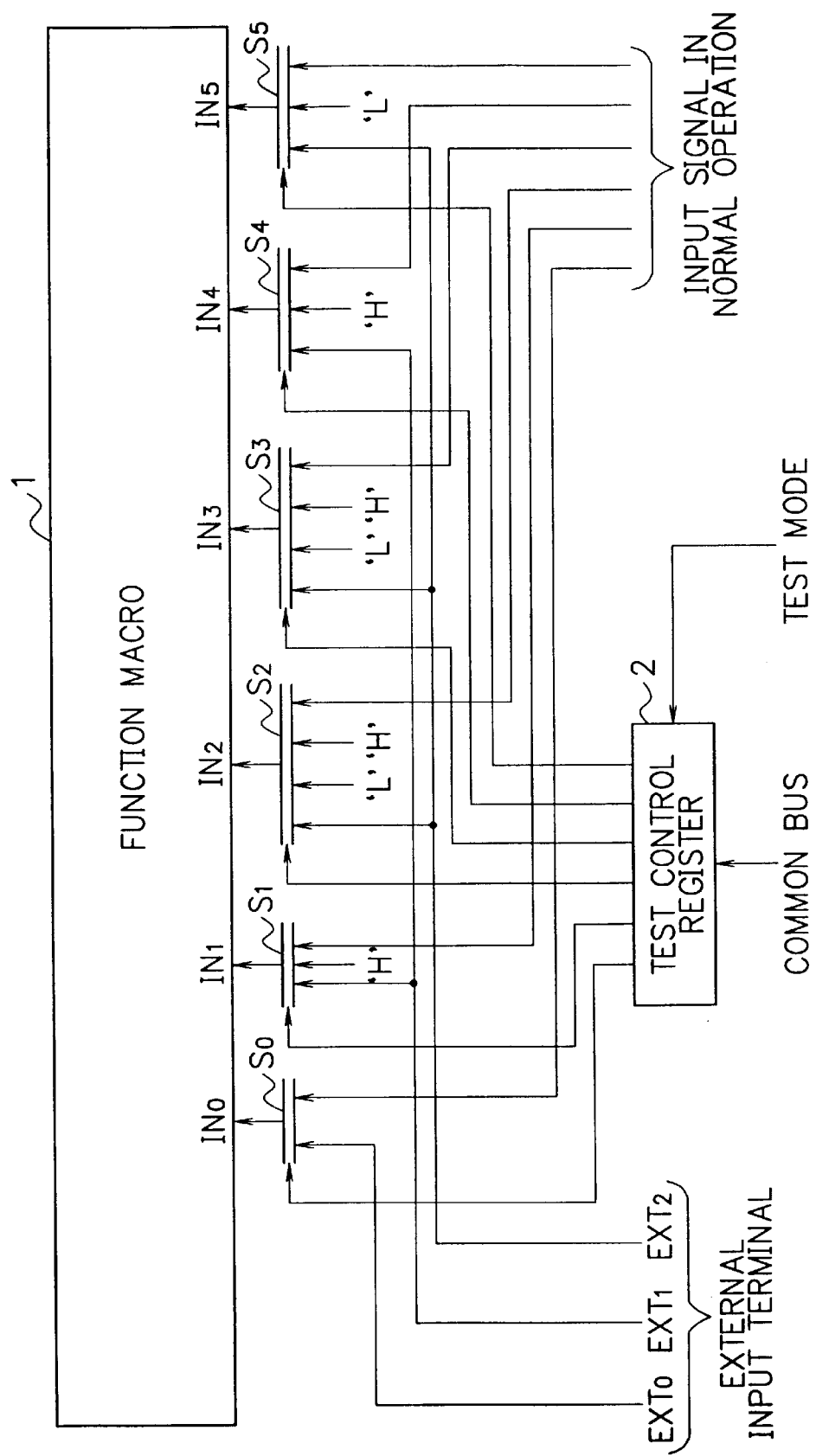
FIG. 5 is a circuit diagram showing an construction when the function macro has six input terminals, and the integrated circuit has three external input terminals for inputting test pattern signals in the fundamental construction shown in FIG. 4.
Figure 6:
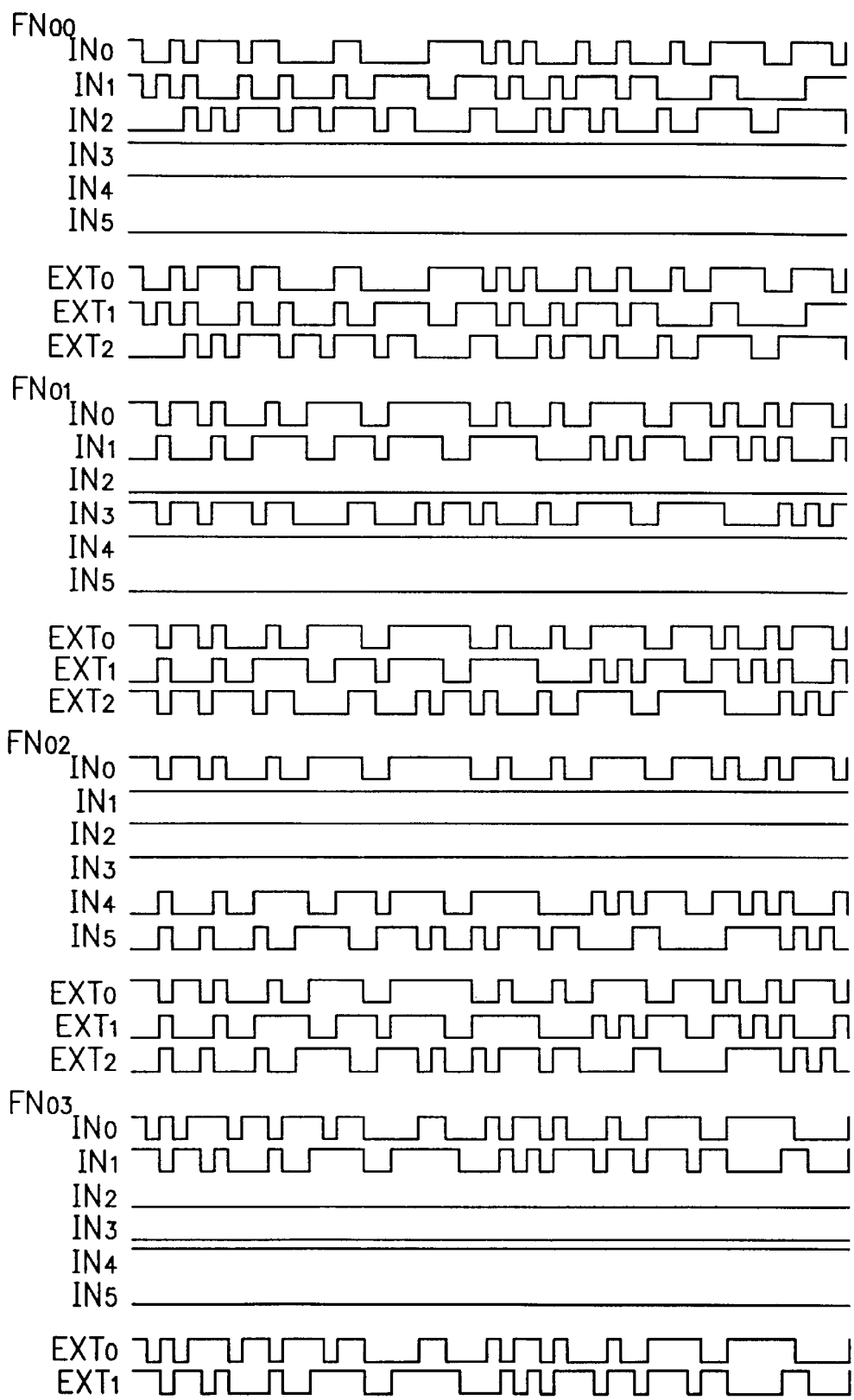
FIG. 6 is a timing chart showing an example of signals input to the input terminals and the external input terminals shown in FIG. 5.

FIG. 5 is a circuit diagram showing an construction when the function macro 1 has six input terminals IN0 to IN5, and the integrated circuit has three external input terminals EXT0 to EXT2 for inputting test pattern signals whose logic levels vary in the fundamental construction shown in FIG. 4. FIG. 6 is a timing chart showing an example of signals input to the input terminals IN0 to IN5 and external input terminals EXT0 to EXT2. The operation will be explained with reference to FIGS. 5 and 6.

In the example shown in FIG. 6, tests are sequentially run with four test patterns FN00 to FN03 as a function made up from predetermined function units. In the first test pattern FN00, signals supplied to the input terminals IN3, IN4, and IN5 of the function macro 1 are fixed to "H" or "L". In the second test pattern FN01, signals supplied to the input terminals IN2, IN4, and IN5 of the function macro 1 are fixed to "H" or "L". In the third test pattern FN02, signals supplied to the input terminals IN1, IN2, and IN3 of the function macro 1 are fixed to "H". In the fourth test pattern FN03, signals supplied to the input terminals IN2, IN3, IN4, and IN5 of the function macro 1 are fixed to "H" or "L".

From this, of the six input terminals IN0 to IN5 of the function macro 1 shown in FIG. 5, the zeroth input terminal IN0 receives a signal whose value is not fixed to "H" or "L" and varies with time elapsing, in all the test patterns FN00 to FN03. The selector S0 corresponding to the input terminal IN0 receives two inputs: a test pattern signal input from the external input terminal EXT0 of the integrated circuit in function test operation, and a signal input from a circuit other than the function macro 1 in normal operation the selector S0 selects either of the signals, and supplies the selected one to the function macro 1. In this case, the external input terminal EXT0 is dedicated to the input terminal IN0 of the function macro 1.

The input terminals IN1 to IN5 except for the zeroth input terminal IN0 of the function macro 1 receive signals whose values are fixed to "H" or "L" on at least one test pattern the selectors S1 to S5 corresponding to the input terminals IN1 to IN5 receive signals input from the external input terminals EXT1 and EXT2 of the integrated circuit in function test operation, signals input from a circuit other than the function macro 1 in normal operation, and "H" or "L" fixed-logic signals. The selectors S1 to S5 select any of the signals, and supply the selected signals to the input terminals IN1 to IN5 of the function macro 1.

Of the external input terminals EXT1 and EXT2 connected to the selectors S1 to S5 provided to correspond to the respective input terminals IN1 to IN5 whose input signals can be fixed on any test pattern, one external input terminal EXT1 is shared by the two input terminals IN1 and IN4 of the function macro 1, and the other external input terminal EXT2 is shared by the three input terminals IN2, IN3, and IN5 of the function macro 1.

In all the test patterns FN00 to FN03, a test pattern signal input from the external input terminal EXT1 is not simultaneously used by the two input terminals IN1 and IN4 (either of the input terminals IN1 and IN4 is always fixed to "H"). A test pattern signal input from the external input terminal EXT2 is not simultaneously used by the two or more of the three input terminals IN2, IN3, and IN5 (two of them are always fixed to "H" or "L"). Hence, one external input terminal can be shared by input terminals of the function macro 1.

Before a test mode is set, control information for controlling the selection states of the selectors S0 to S5 for each of the test patterns FN00 to FN03 is stored in the test control register 2 via the common bus also connected to the function macro 1. That is, a dedicated address is assigned to the test control register 2 (part of the address space is assigned to the test control register 2). Necessary control information is written in the test control register 2 in accordance with the same procedures as those of externally exchanging data by the function macro 1. After a test mode is set, pieces of control information stored in the test control register 2 are sequentially supplied to the control terminals of the selectors S0 to S5 for each test pattern these selectors S0 to S5 switch input selection states in accordance with the pieces of control information input from the test control register 2.

In executing a test with the first test pattern FN00, the selectors S0 to S2 select test pattern signals from the external input terminals EXT0 to EXT2, the selectors S3 and S4 select "H" fixed-logic signals, and the selector S5 selects an "L" fixed-logic signal. In executing a test with the second test pattern FN01, the selectors S0, S1, and S3 select test pattern signals from the external input terminals EXT0 to EXT2, the selector S4 selects an "H" fixed-logic signal, and the selectors S2 and S5 select "L" fixed-logic signals.

In executing a test with the third test pattern FN02, the selectors S0, S4, and S5 select test pattern signals from the external input terminals EXT0 to EXT2, and the selectors S1 to S3 select "H" fixed-logic signals. In executing a test with the fourth test pattern FN03, the selectors S0 and S1 select test pattern signals from the external input terminals EXT0 and EXT1, the selector S4 selects an "H" fixed-logic signal, and the selectors S2, S3, and S5 select "L" fixed-logic signals.

In the first embodiment shown in FIG. 4, a fixed-logic signal generated in a test control circuit (not shown) inside the integrated circuit is selectively supplied to, of the input terminals IN0 to INn of the function macro 1, the input terminals INm+1 to INn for inputting signals whose values are fixed to "H" or "L" on at least one test pattern. Hence, no fixed-logic signals need be input from the external input terminals EXT0 to EXTk of the integrated circuit.

Of the external input terminals EXT0 to EXTk of the integrated circuit, the external input terminals EXTm+1 to EXTn connected to the selectors Sm+1 to Sn provided to correspond to the respective input terminals INm+1 to INn whose input signals can be fixed, are shared by input terminals of the function macro 1 including terminals which do not simultaneously use one external input terminal as far as a test pattern signal input from the external input terminal is not simultaneously used by two or more input terminals.

The external input terminals EXT0 to EXTk for inputting test pattern signals need not be equal in number to the input terminals IN0 to INn of the function macro 1 (k<n). The number of external input terminals can be reduced. In the construction of FIG. 5, necessary external input terminals in a function test are only the three external input terminals EXT0 to EXT2, and the number of terminals can be reduced by three. In particular, when the function macro 1 is a processor, the processor often comprises ten-odd to several ten terminals whose input signal values can be fixed in a specific test. The number of external input terminals can be greatly reduced.

In the first embodiment, the selectors S0 to Sn provided on the input side of the function macro 1 are controlled in accordance with control information set in the test control register 2, and the control information in the test control register 2 is set using the common bus of the integrated circuit. The integrated circuit does not require any special terminal for writing control information in the test control register 2 from outside the integrated circuit. This can suppress an increase in the number of external input terminals. Control information suffices to be written in the test control register 2 in accordance with a transaction defined in advance, and no special procedures need be newly prepared. The merit of using the common bus is attained similarly in the following embodiments.

Second Embodiment

Figure 7:
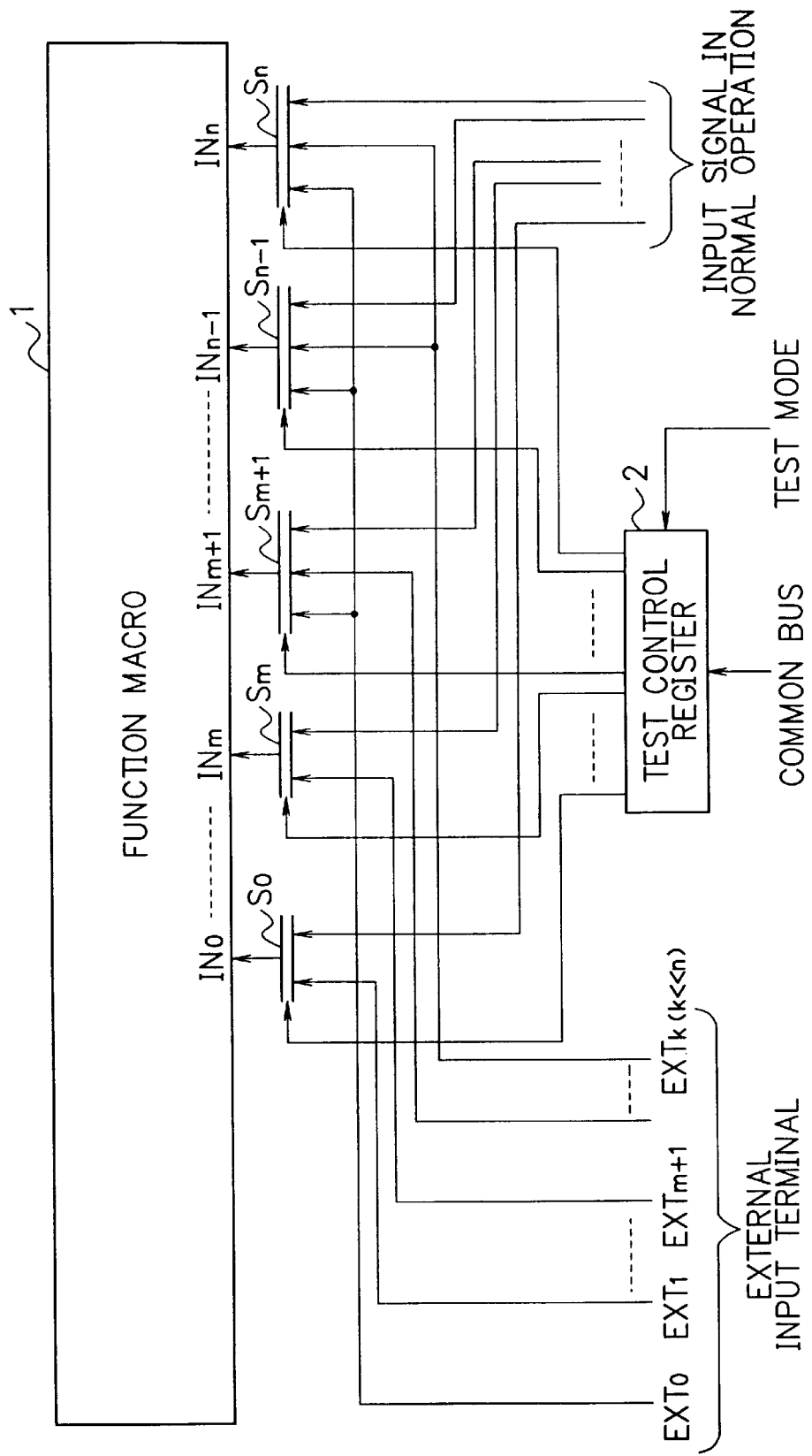
FIG. 7 is a circuit diagram showing a fundamental construction of the second embodiment of the present invention for running a function test on a function macro.

FIG. 7 is a circuit diagram showing a fundamental construction of the second embodiment of the present invention for running a function test on a function macro. As shown in FIG. 7, a function macro 1 comprises input terminals IN0, . . . , INm, INm+1, . . . , INn−1, INn. Selectors S0, . . . , Sm, Sm+1, . . . , Sn−1, Sn are so provided as to correspond to the respective input terminals IN0, . . . , INm, INm+1, . . . , INn−1, INn.

Of these input terminals IN0 to INn, the first to (m+1)th input terminals IN0 to INm input unique signals different from signals to the remaining terminals on all test patterns. Each of the selectors S0 to Sm corresponding to the input terminals IN0 to INm receives two inputs: a test pattern signal input from the corresponding one of external input terminals EXT1 to EXTm+1 of an integrated circuit, and a signal input from a circuit of the integrated circuit other than the function macro 1 in normal operation. Each selector selects either of the signals, and supplies the selected one to the corresponding one of the input terminals IN0 to INm of the function macro 1.

The (m+1)th to n-th input terminals INm+1 to INn of the function macro 1 can input the same signal on at least one test pattern. Each of the selectors Sm+1 to Sn corresponding to the input terminals INm+1 to INn receives three inputs: one test pattern signal input from an external input terminal EXT0 in function test operation, a different test pattern signal input from another external input terminal, and a signal input from a circuit of the integrated circuit other than the function macro 1 in normal operation. Each selector selects any one of these signals, and supplies the selected one to the corresponding one of the input terminals INm+1 to INn of the function macro 1.

In function test operation, the selectors Sn−1 and Sn select either of a test pattern signal input from the external input terminal EXT0 commonly connected to the selectors Sm+1 to Sn provided to correspond to the respective input terminals INm+1 to INn of the function macro 1, and a test pattern signal input from an external input terminal EXTk commonly connected to the selectors Sn−1 and Sn provided to correspond to the respective input terminals INn−1 and INn. The selectors Sn−1 and Sn supply the selected signal to the corresponding input terminals INn−1 to INn.

In the second embodiment, one external input terminal is shared between, of the input terminals IN0 to INn of the function macro 1, input terminals capable of inputting the same test pattern on at least one test pattern (one external input terminal EXT0 is shared between the input terminals INm+1, . . . , INn−1, INn, and one external input terminal EXTk is shared between the two input terminals INn−1 and INn). Test pattern signals input to one selector are not simultaneously used by an input terminal of the function macro 1 corresponding to this selector.

The selectors S0 to Sn switch input selection states in accordance with pieces of control information input from a test control register 2 to the control terminals of the selectors S0 to Sn in setting a test mode. Before a test mode is set, these pieces of control information for controlling the selection states of the selectors S0 to Sn for each test pattern of a function test are stored in the test control register 2 via the common bus of the integrated circuit also connected to the function macro 1.

Figure 8:
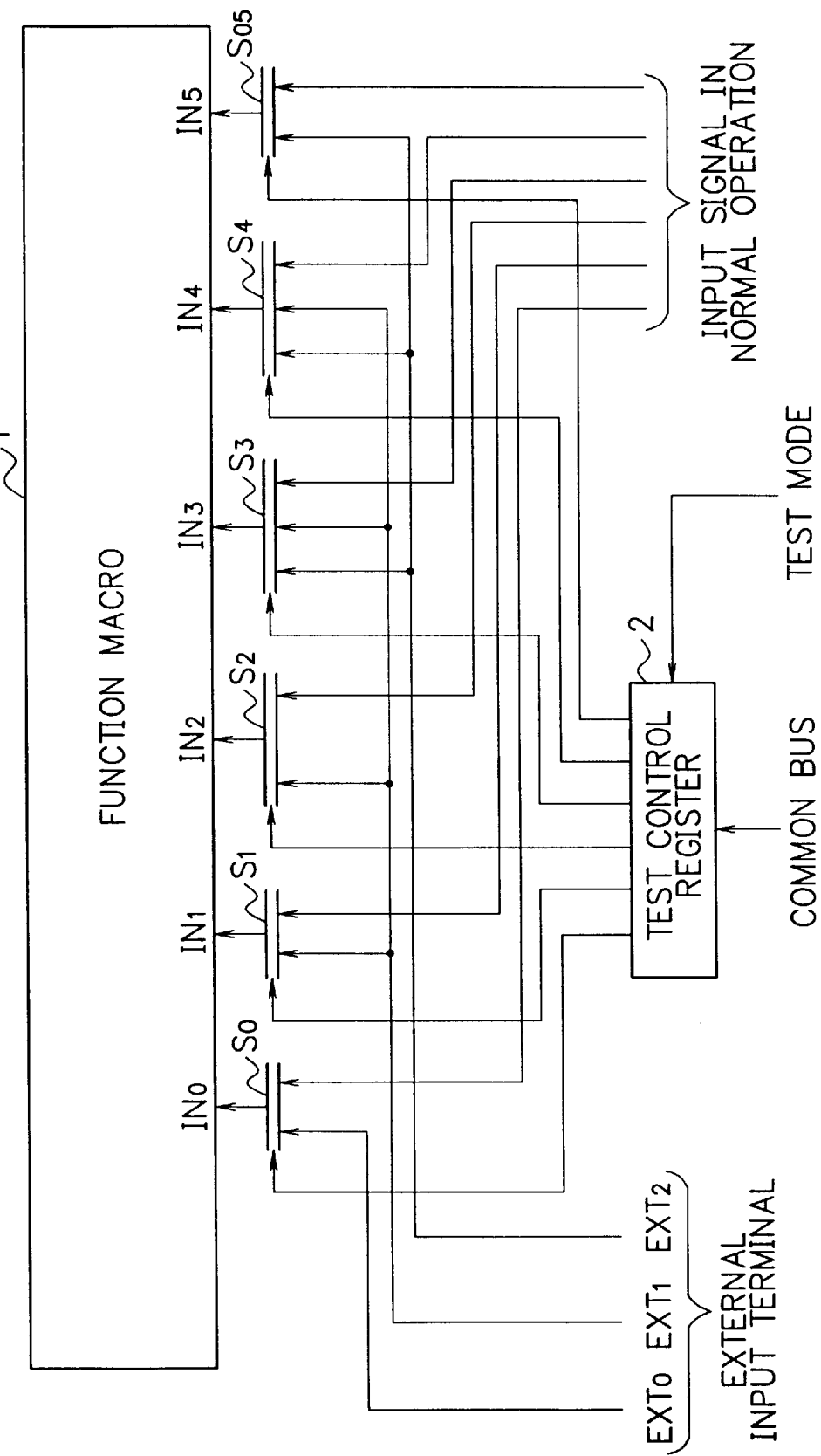
FIG. 8 is a circuit diagram showing an construction when the function macro has six input terminals, and the integrated circuit has three external input terminals for inputting test pattern signals in the fundamental construction shown in FIG. 7.
Figure 9:
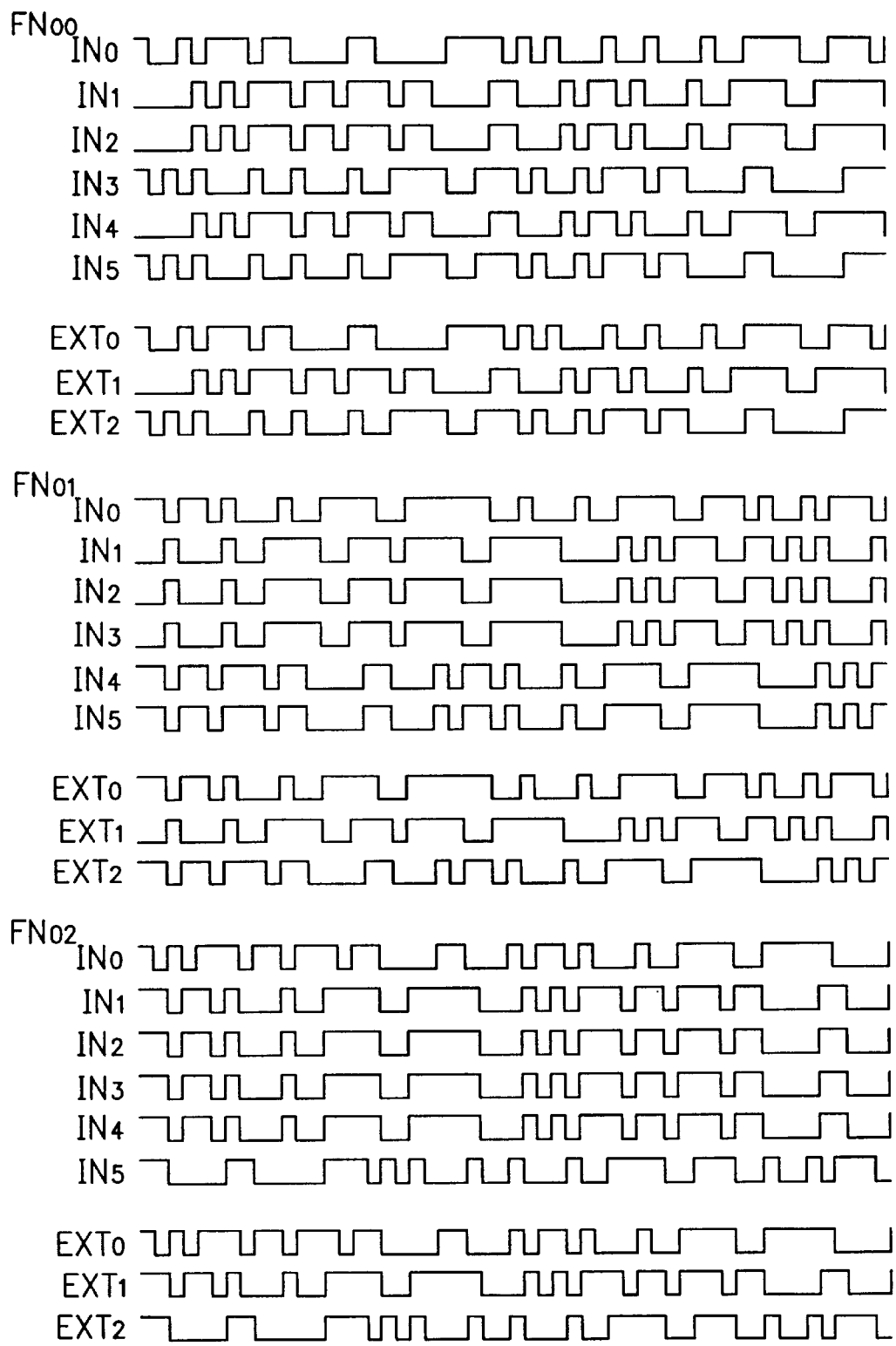
FIG. 9 is a timing chart showing an example of signals input to the input terminals and the external input terminals shown in FIG. 8.

FIG. 8 is a circuit diagram showing an construction when the function macro 1 has six input terminals IN0 to IN5, and the integrated circuit has three external input terminals EXT0 to EXT2 for inputting test pattern signals in the fundamental construction shown in FIG. 7. FIG. 9 is a timing chart showing an example of signals input to the input terminals IN0 to IN5 and the external input terminals EXT0 to EXT2. The operation will be explained with reference to FIGS. 8 and 9.

In the example shown in FIG. 9, tests are sequentially run with three test patterns FN00 to FN02 as a function made up from predetermined function units. In the first test pattern FN00, one test pattern signal is commonly supplied to the input terminals IN1, IN2, and IN4 of the function macro 1, another different test pattern signal is commonly supplied to the input terminals IN3 and IN5, and still another different test pattern signal is supplied to the input terminal IN0.

In the second test pattern FN01, one test pattern signal is commonly supplied to the input terminals IN1 to IN3 of the function macro 1, another different test pattern signal is commonly supplied to the input terminals IN4 and IN5, and still another different test pattern signal is supplied to the input terminal IN0. In the third test pattern FN02, one test pattern signal is commonly supplied to the input terminals IN1 to IN4 of the function macro 1, and different test pattern signals are respectively supplied to the input terminals IN0 and IN5.

From this, of the six input terminals IN0 to IN5 of the function macro 1 shown in FIG. 8, the zeroth input terminal IN0 receives a unique test pattern signal on all the test patterns FN00 to FN02. The selector S0 corresponding to the input terminal IN0 receives two inputs: a test pattern signal input from the external input terminal EXT0 of the integrated circuit in function test operation, and a signal input from a circuit other than the function macro 1 in normal operation. The selector S0 selects either of these signals, and supplies the selected one to the input terminal IN0 of the function macro 1. In this case, the external input terminal EXT0 is dedicated to the input terminal IN0 of the function macro 1.

The first to fourth input terminals IN1 to IN4 of the function macro 1 can input the same test pattern signal on at least one test pattern (e.g., FN02). The selectors S1 to S4 corresponding to the input terminals IN1 to IN4 are commonly connected to the external input terminal EXT1 of the integrated circuit. The third to fifth input terminals IN3 to IN5 can input the same test pattern signal on at least one test pattern (the input terminals IN3 and IN5 receive the same signal on the first test pattern FN00, the input terminals IN4 and IN5 receive the same signal on the second test pattern FN01, and the input terminals IN3 and IN4 receive the same signal on the third test pattern FN02). The selectors S3 to S5 corresponding to the input terminals IN3 to IN5 are commonly connected to the external input terminal EXT2 of the integrated circuit.

In this construction, the selectors S3 and S4 corresponding to the two input terminals IN3 and IN4 of the function macro 1 receive two test pattern signals from the two external input terminals EXT1 and EXT2. These test pattern signals are not simultaneously used by the input terminals IN3 and IN4.

Before a test mode is set, pieces of control information for controlling the selection states of the selectors S0 to S5 for each of the test patterns FN00 to FN02 are stored in the test control register 2 via the common bus also connected to the function macro 1. After a test mode is set, pieces of control information stored in the test control register 2 are sequentially supplied to the control terminals of the selectors S0 to S5 for each test pattern. These selectors S0 to S5 switch input selection states in accordance with the pieces of control information input from the test control register 2.

In executing a test with the first test pattern FN00, the selector S0 selects a test pattern signal from the external input terminal EXT0, the selectors S1, S2, and S4 select a test pattern signal from the external input terminal EXT1, and the selectors S3 and S5 select a test pattern signal from the external input terminal EXT2.

In executing a test with the second test pattern FN01, the selector S0 selects a test pattern signal from the external input terminal EXT0, the selectors S1 to S3 select a test pattern signal from the external input terminal EXT1, and the selectors S4 and S5 select a test pattern signal from the external input terminal EXT2.

In executing a test with the third test pattern FN02, the selector S0 selects a test pattern signal from the external input terminal EXT0, the selectors S1 to S4 select a test pattern signal from the external input terminal EXT1, and the selector S5 selects a test pattern signal from the external input terminal EXT2.

In the second embodiment shown in FIG. 7, one external input terminal is shared between, of the input terminals, IN0 to INn of the function macro 1, input terminals capable of inputting the same test pattern on at least one test pattern. Therefore, the same test pattern signal need not be input from different external input terminals of the integrated circuit.

The external input terminals EXT0 to EXTk for inputting test pattern signals in a function test need not be equal in number to the input terminals IN0 to INn of the function macro 1 (k<n). The number of external input terminals can be reduced. In the construction of FIG. 8, necessary external input terminals in a function test are only the three external input terminals EXT0 to EXT2, and the number of terminals can be reduced by three.

Third Embodiment

Figure 10:
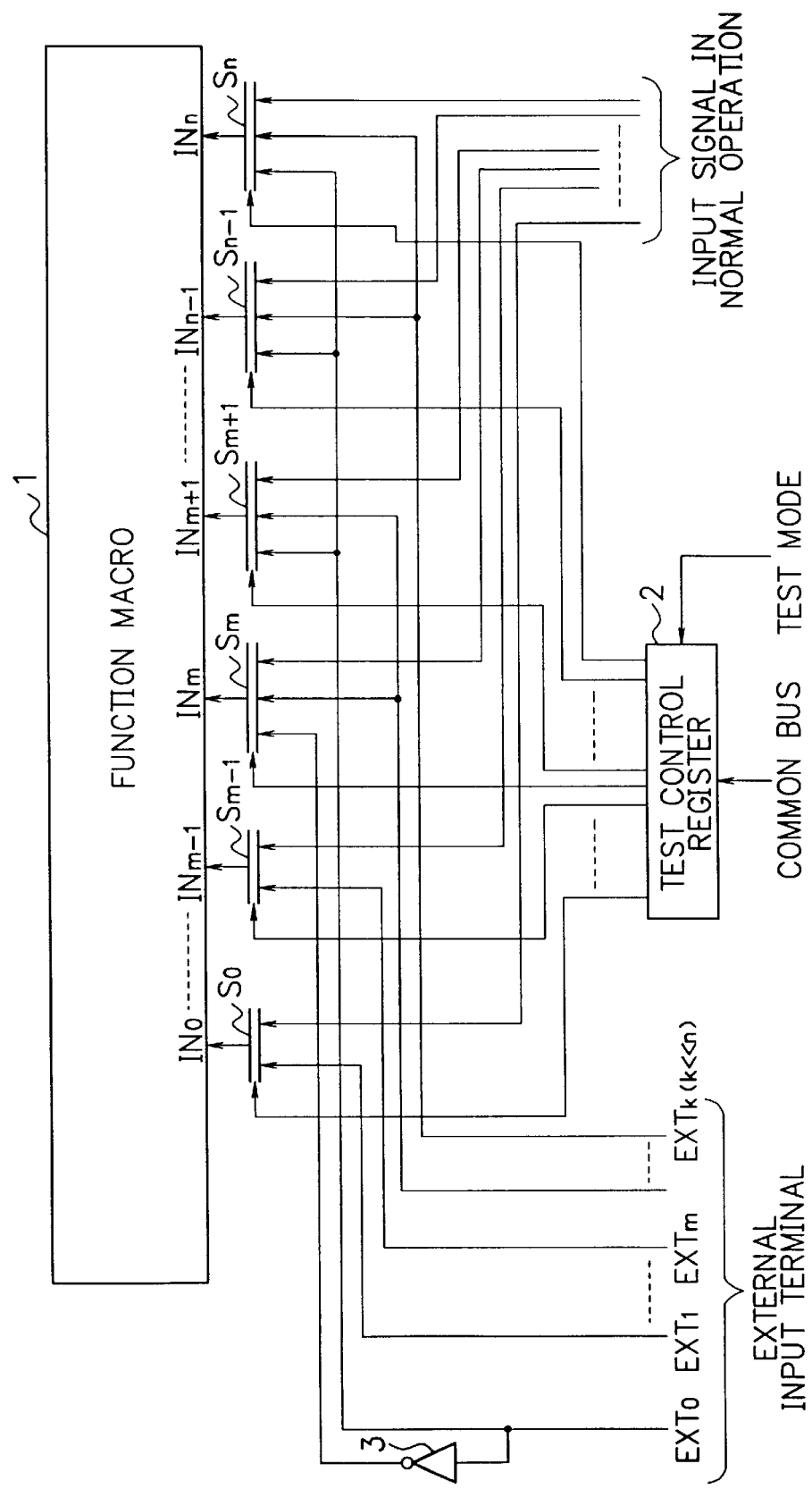
FIG. 10 is a circuit diagram showing a fundamental construction of the third embodiment of the present invention for running a function test on a function macro.

FIG. 10 is a circuit diagram showing a fundamental construction of the third embodiment of the present invention for running a function test on a function macro. In the third embodiment, when two test pattern signals used in a certain test pattern are opposite logic signals, only one signal is input from an external input terminal to the input terminal of a function macro 1, and the other, opposite logic signal is generated from the input signal by an inverter inside an integrated circuit.

Also in the third embodiment shown in FIG. 10, the function macro 1 comprises input terminals IN0 to INn. Selectors S0 to Sn are so provided as to correspond to the respective input terminals IN0 to INn.

A test pattern signal input to the m-th input terminal INm among these input terminals IN0 to INn, and a test pattern signal input to the (m+1)th to n-th input terminals INm+1 to INn are opposite logic signals.

The (m+1)th to n-th input terminals INm+1 to INn can input the same signal on at least one test pattern. Similarly to the second embodiment, the input terminals INm+1 to INn share one external input terminal EXT0, and the corresponding selectors Sm+1 to Sn are connected to the common external input terminal EXT0, the integrated circuit comprises an inverter 3 for inverting the logic of a test pattern signal input from the external input terminal EXT0. An output signal from the inverter 3 is input to the selector Sm corresponding to the input terminal INm.

In the third embodiment, when two test pattern signals used in a function test are opposite logic signals, only one signal is input from an external input terminal, and the other, opposite logic signal is generated from the input signal using the inverter 3 inside the integrated circuit. One external input terminal is shared between, of the input terminals IN0 to INn of the function macro 1, input terminals capable of inputting test pattern signals of opposite logic levels on at least one test pattern.

The external input terminals EXT0 to EXTk for inputting test pattern signals in a function test need not be equal in number to the input terminals IN0 to INn of the function macro 1 (k<n). The number of external input terminals can be decreased.

In the embodiment of FIG. 10, as well as the second embodiment, one external input terminal is shared between, of the input terminals IN0 to INn of the function macro 1, input terminals capable of inputting the same test pattern signal on at least one test pattern. However, the third embodiment need not always be combined with the second embodiment. A test pattern signal whose logic is inverted by the inverter 3 is input to only one input terminal of the function macro 1 in the embodiment of FIG. 10, but may be input to, input terminals.

Fourth Embodiment

FIG. 11 is a circuit diagram showing a fundamental construction of the fourth embodiment of the present invention for running a function test on a function macro. In the fourth embodiment, when of two test pattern signals used in a certain test pattern, the other signal is a signal delayed from one test pattern signal by a predetermined number of clocks or is an opposite logic signal, only one signal is input from an external input terminal to the input terminal of a function macro 1, and the signal delayed by a predetermined number of clocks or the opposite logic signal is generated from the input signal by a delay circuit inside an integrated circuit.

Also in the fourth embodiment shown in FIG. 11, the function macro 1 comprises input terminals IN0 to INn. Selectors S0 to Sn are so provided as to correspond to the respective input terminals IN0 to INn.

A test pattern signal input to the m-th input terminal INm among these input terminals IN0 to INn is a signal delayed by a predetermined number of clocks from a test patter signal input to the (m+1)th to n-th input terminals INm+1 to INn, or is an opposite logic signal.

The (m+1)th to n-th input terminals INm+1 to INn can input the same signal on at least one test pattern. Similarly to the second embodiment, the input terminals INm+1 to INn share one external input terminal EXT0, and the corresponding selectors Sm+1 to Sn are connected to the common external input terminal EXT0, the integrated circuit comprises a delay circuit 4 for delaying a test pattern signal input from the external input terminal EXT0. An output signal from the delay circuit 4 is input to the selector Sm corresponding to the input terminal INm.

As an output signal, the delay circuit 4 outputs, from its Q terminal, a signal obtained by delaying a test pattern signal input from the external input terminal EXT0 by a predetermined number of clocks, and outputs, from its $\overline{Q}$ terminal, an opposite logic signal of the test pattern signal output from the, Q terminal. The delay amount or the predetermined number of clocks in the delay circuit 4 is adjusted based on control information supplied from a test control register 2.

In the fourth embodiment, when a test pattern signal used in a function test is a signal delayed from one test pattern signal by a predetermined number of clocks or is an opposite logic signal, only the one signal is input from the external input terminal. The signal delayed by a predetermined number of clocks or an opposite logic signal is generated from the input signal using the delay circuit 4 inside the integrated circuit. One external input terminal is shared between, of the input terminals IN0 to INn of the function macro 1, input terminals capable of inputting related test pattern signals on at least one test pattern.

The external input terminals EXT0 to EXTk for inputting test pattern signals in a function test need not be equal in number to the input terminals IN0 to INn of the function macro 1 (k<n). The number of external input terminals can be reduced.

In the embodiment of FIG. 11, as well as the second embodiment, one external input terminal is shared between, of the input terminals IN0 to INn of the function macro 1, input terminals capable of inputting the same test pattern signal on at least one test pattern. However, the fourth embodiment need not always be combined with the second embodiment. A test pattern signal delayed by the delay circuit 4 is input to only one input terminal of the function macro 1 in the embodiment of FIG. 11, but may be input to input terminals.

Figure 12A:
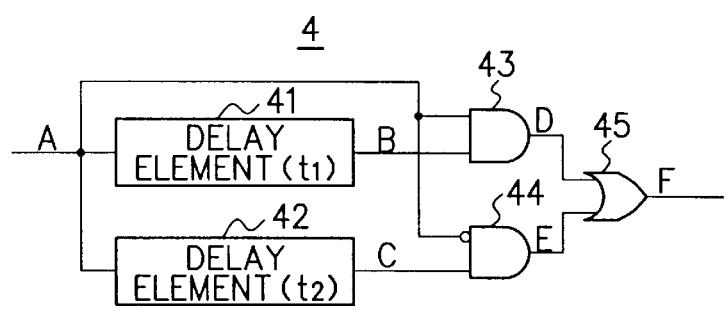
FIG. 12A is a circuit diagram showing an construction of the delay circuit shown in FIG. 11.
Figure 12B:
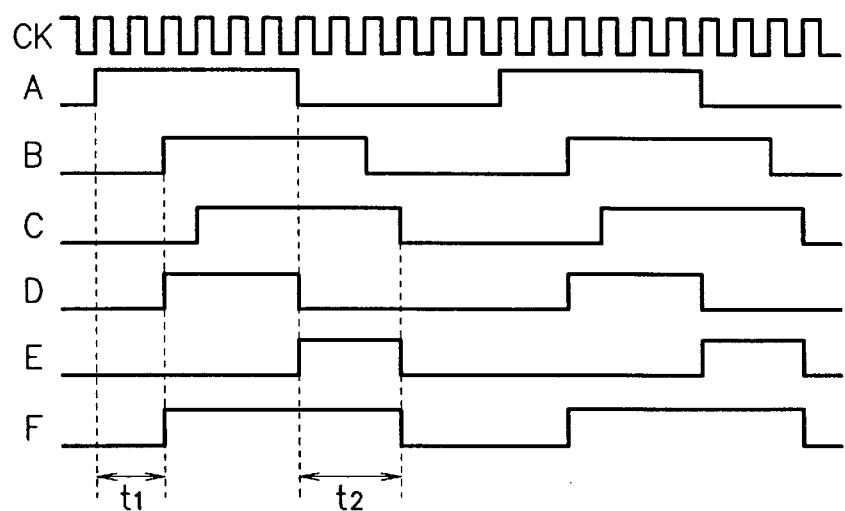
FIG. 12B is a timing chart showing the operation of the delay circuit shown in FIG. 11.

FIGS. 12A and 12B are a circuit diagram and a timing chart showing an construction and the operation of the delay circuit 4, in which FIG. 12A is a circuit diagram showing the construction of the delay circuit 4, and FIG. 12B is a timing chart showing its operation. The example of the delay circuit 4 shown in FIG. 12A comprises a delay element 41 for delaying the clock leading edge timing by a predetermined number of clocks (time $t_1$), and a delay element 42 for delaying the clock trailing edge timing by another predetermined number of clocks (time $t_2$).

This delay circuit 4 further comprises a gate 43 for performing AND operation of an output signal from the delay element 41 and an original signal before being delayed, a gate 44 for performing AND operation of an output signal from the delay element 42 and an opposite logic signal of an original signal before being delayed, and a gate 45 for performing OR operation of output signals from the two gates 43 and 44.

The delay amounts $t_1$ and $t_2$ of the two delay elements 41 and 42 are determined in accordance with control information supplied from the test control register 2 in FIG. 11.

Signals appearing at nodes A to F shown in FIG. 12A are shown in FIG. 12B. In this example, the delay circuit 4 generates, from an input original signal at the node A, a signal whose leading edge is delayed by the time $t_1$ and whose trailing edge is delayed by the time $t_2$, and outputs the delayed signal to the node F. The delay circuit 4 having this construction allows sharing one external input terminal by input terminals of the function macro 1 even when a certain test pattern signal used in a function test is a signal obtained by changing both the leading and trailing edge delay amounts for another test pattern signal.

Fifth Embodiment

FIG. 13 is a circuit diagram showing a fundamental construction of the fifth embodiment of the present invention for running a function test on a function macro. The fifth embodiment shown in FIG. 13 is a combination of the first to fourth embodiments.

In the embodiment shown in FIG. 13, of input terminals IN0 to INn of the function macro 1, e.g., the zeroth input terminal IN0 receives any one signal selected by a selector S0 from a test pattern signal input from an external input terminal EXT0, a test pattern signal whose logic is inverted by an inverter 3, a signal obtained by delaying the signal whose logic is inverted by the inverter 3, by a delay circuit 4a by a predetermined number of clocks and an opposite logic signal, a test pattern signal input from another external input terminal EXT1, "H" and "L" fixed-logic signals, an input signal in normal operation, and a reset signal input from a reset terminal RESET.

The (n−1)th input terminal INn−1 receives any one signal selected by a selector Sn−1 from a test pattern signal input from the external input terminal EXT0, a test pattern signal whose logic is inverted by the inverter 3, a signal obtained by delaying the signal whose logic is inverted by the inverter 3, by a delay circuit 4b by a predetermined number of clocks and an opposite logic signal, a test pattern signal input from another external input terminal EXTk, "H" and "L" fixed-logic signals, an input signal in normal operation, and a reset signal input from the reset terminal RESET.

The n-th input terminal INn receives any one signal selected by a selector Sn from a test pattern signal input from the external input terminal EXT0, a test pattern signal whose logic is inverted by the inverter 3, a signal obtained by delaying the signal whose logic is inverted by the inverter 3, by a delay circuit 4c by a predetermined number of clocks and an opposite logic signal, a test pattern signal input from the external input terminal EXTk, "H" and "L" fixed-logic signals, an input signal in normal operation, and a reset signal input from the reset terminal RESET.

Also in this embodiment, the external input terminals EXT0 to EXTk for inputting test pattern signals in a function test need not be equal in number to the input terminals IN0 to INn of the function macro 1 (k<n). In the fifth embodiment, a larger number of external input terminals can be shared between input terminals of the function macro 1. The number of external input terminals can be reduced in comparison with a case in which the above-described embodiments are independently applied.

Sixth Embodiment

FIG. 14 is a circuit diagram showing a fundamental construction of the sixth embodiment of the present invention for running a function test on a function macro. The fifth embodiment shown in FIG. 13 can greatly reduce the number of external input terminals. However, the size of the selectors S0 to Sn increases, and the amount of control information in the test control register 2 for controlling the selection states of the selectors S0 to Sn increases.

To the contrary, the sixth embodiment shown in FIG. 14 inputs a minimum number of signals to selectors S0 to Sn. This can suppress an excessive increase in the size of the selectors S0 to Sn, and can reduce the amount of control information in the test control register 2 for controlling the selection states of the selectors S0 to Sn. The sixth embodiment shown in FIG. 14 is a combination of the first and second embodiments, but a combination of embodiments is not limited to this.

Seventh Embodiment

Figure 15:
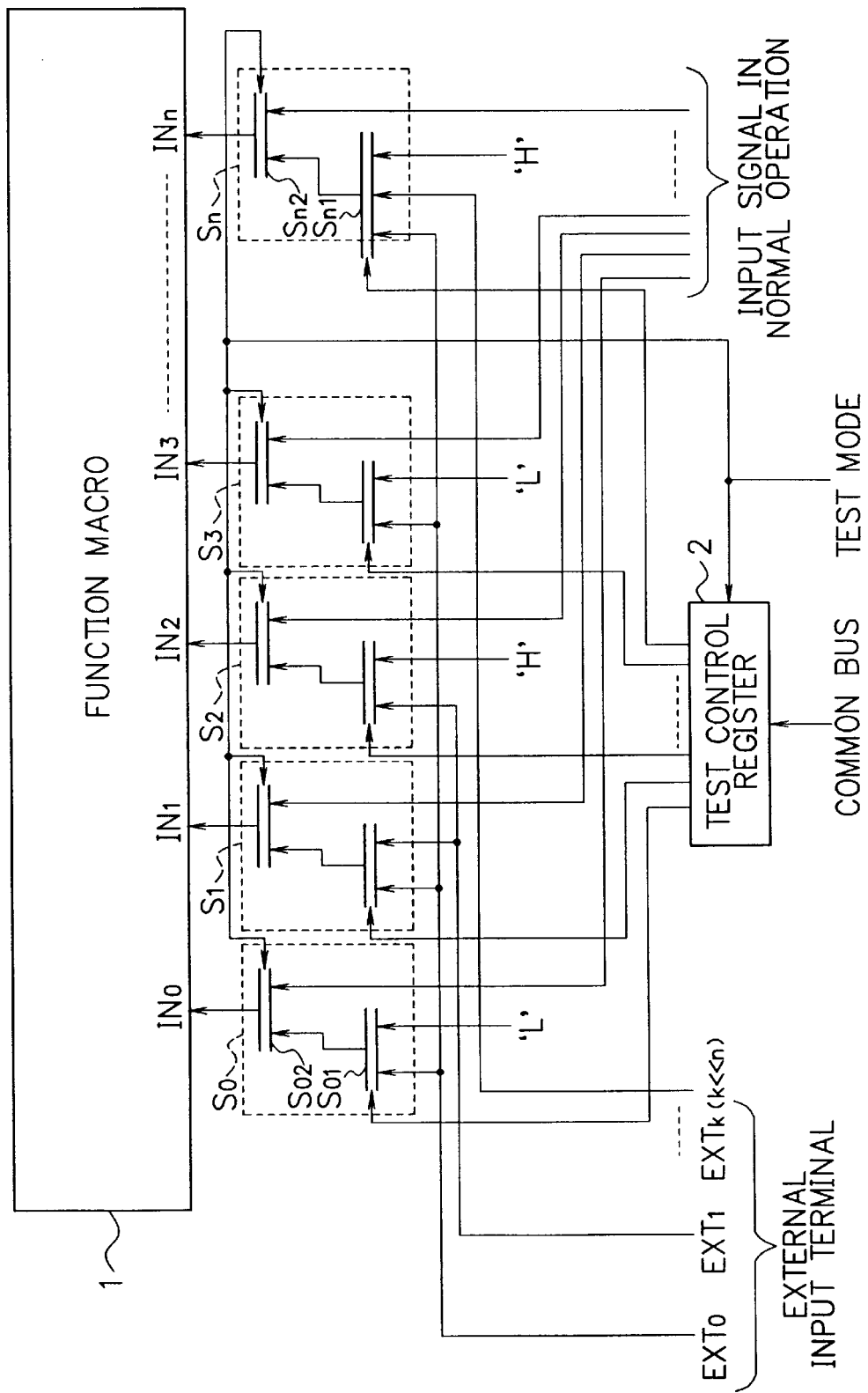
FIG. 15 is a circuit diagram showing a fundamental construction of the seventh embodiment of the present invention for running a function test on a function macro.

FIG. 15 is a circuit diagram showing a fundamental construction of the seventh embodiment of the present invention for running a function test on a function macro. In the first to sixth embodiments, one or more test pattern signals which are input from the external input terminal of an integrated circuit or generated inside the integrated circuit in function test operation, and a signal input from a circuit of the integrated circuit other than the function macro 1 in normal operation are supplied to one selector. The selector selects a signal to be used from the inputs at once.

In the seventh embodiment, two selectors are so provided as to correspond to one input terminal of a function macro 1. One of the selectors selects a signal to be used from test pattern signals. The other selector selects either of the test pattern signal selected by one selector, and an input signal in normal operation, and supplies the selected signal to the corresponding input terminal of the function macro 1.

In the embodiment shown in FIG. 15, two-stage selectors S0 to Sn are so provided as to correspond to the respective input terminals IN0 to INn of the function macro 1. For example, the zeroth selector S0 has two selectors S01 and S02. The first selector S01 receives two inputs: a test pattern signal input from an external input terminal EXT0 and a test pattern signal fixed to "L" level. The selector S01 selects either of these signals, and supplies the selected one to the second selector S02.

The second selector S02 receives two inputs: the test pattern signal selected by the first selector S01, and a signal input from a circuit of the integrated circuit other than the function macro 1 in normal operation. The selector S02 selects either of these signals, and supplies the selected one to the corresponding input terminal IN0 of the function macro 1.

In this case, the selection state in the first selector S01 is controlled in accordance with control information supplied from a test control register 2. The selection state in the second selector S02 is controlled in accordance with a test mode signal supplied from a test control circuit (not shown). That is, the second selector S02 selects a test pattern signal supplied from the first selector S01 when a test mode is set, and selects a signal input from a circuit of the integrated circuit other than the function macro 1 in normal operation when the test mode is not set.

In the selector S0 having this construction, each of the selectors S01 and S02 selects two inputs. Control information in the test control register 2 for controlling the selection state can be one bit long for one selector S0. This can reduce the amount of control information and reduce the burden on the selector S0.

When the number of test pattern signals selectable by the first selector Sn1 is three (test pattern signals input from the two external input terminals EXT0 and EXT1 and a test pattern signal fixed to "H"), like the n-th selector Sn, the first selector Sn1 receives three inputs. In some cases, the first selector may receive a larger number of inputs.

Eighth Embodiment

The first to seventh embodiments give attention to the input side of the function macro 1, and reduce the number of external input terminals of an integrated circuit for inputting test pattern signals. The following embodiments of the present invention including the eighth embodiment give attention to the output side of a function macro 1 and reduce the number of external output terminals of an integrated circuit for outputting the results of a function test.

Figure 16:
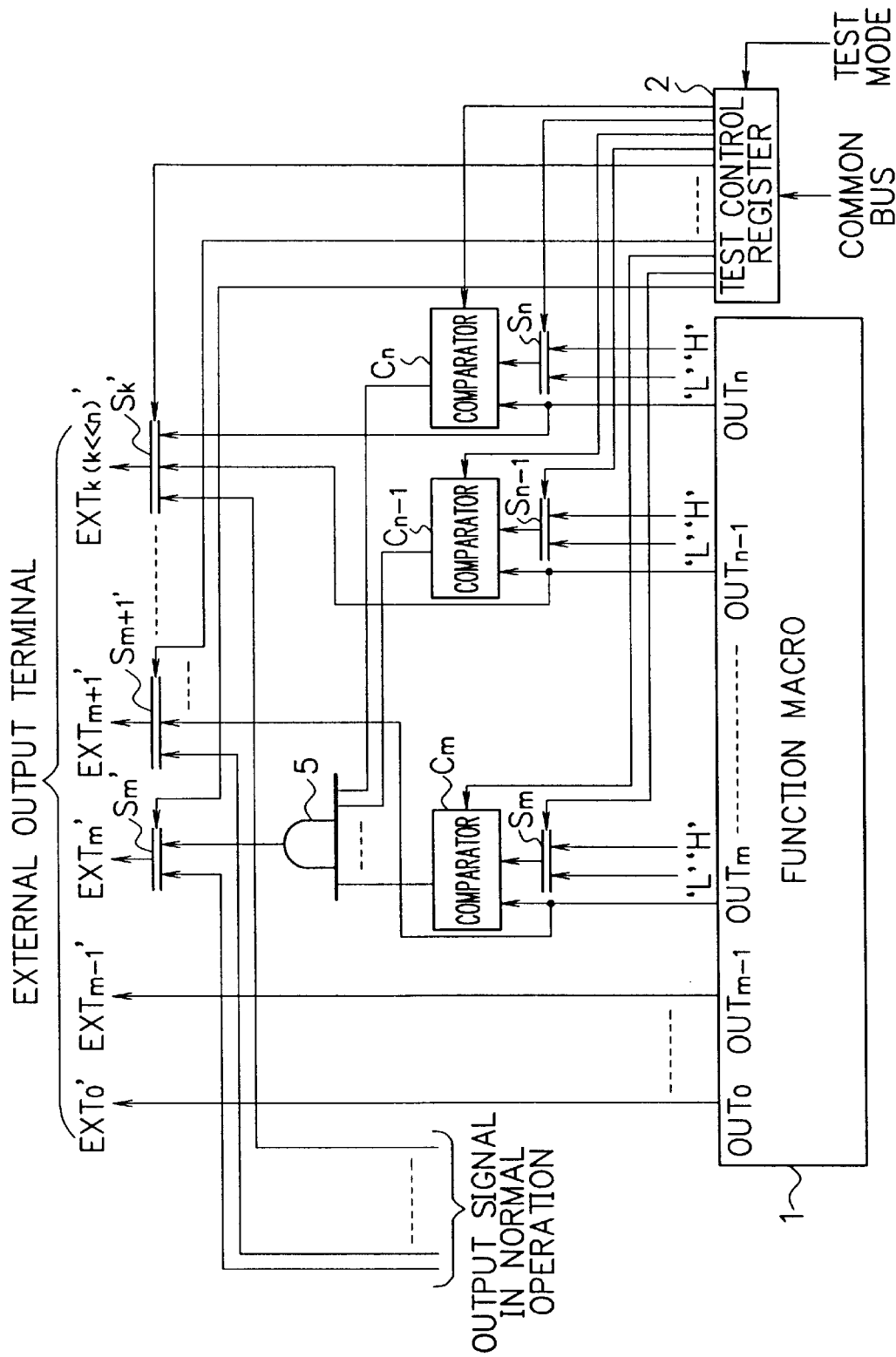
FIG. 16 is a circuit diagram showing a fundamental construction of the eighth embodiment of the present invention for running a function test on a function macro.

FIG. 16 is a circuit diagram showing a fundamental construction of the eighth embodiment of the present invention for running a function test on a function macro. As shown in FIG. 16, the function macro 1 comprises output terminals OUT0, . . . , OUTm−1, OUTm, . . . , OUTn−1, OUTn.

Of these output terminals OUT0 to OUTn, the zeroth to (m−1)th output terminals OUT0 to OUTm−1 are directly connected to external output terminals EXT0' to EXTm−1' of an integrated circuit, and directly output the results of a function test processed by the function macro 1.

Comparators Cm to Cn are so provided as to correspond respectively to the m-th to n-th output terminals OUTm to OUTn. The comparators Cm to Cn compare test result signals output from the corresponding output terminals OUTm to OUTn with "H" or "L" fixed-logic signals selected by selectors Sm to Sn provided to correspond to the respective comparators Cm to Cn. When these signals coincide with each other, the comparators Cm to Cn output "H" signals.

Each of the selectors Sm to Sn receives two inputs: "H" and "L" fixed-logic signals. Each selector selects either of these signals in accordance with control information supplied from a test control register 2. Before a test mode is set, control information for controlling the selection states of the selectors Sm to Sn for each test pattern of a function test is stored in the test control register 2 via the common bus of the integrated circuit also connected to the function macro 1.

The two fixed-logic signals input to each of the selectors Sm to Sn are correct values expected as the results of a function test run in the function macro 1. When the results of a function test using a certain test pattern signal are output as fixed values, the comparators Cm to Cn compare the fixed-logic signals of the test results output from the output terminals OUTm to OUTn with "H" or "L" expectation signals selected by the selectors Sm to Sn in accordance with a target test pattern. The comparators Cm to Cn output the comparison results to an AND gate 5.

In the eighth embodiment, selectors Sm' to Sk' are so provided as to correspond respectively to the m-th to k-th external output terminals EXTm' to EXTk' (k<n) of the integrated circuit. The m-th selector Sm' receives two inputs: a signal output from the AND gate 5 and a signal output from a circuit of the integrated circuit other than the function macro 1 in normal operation. The selector Sm' selects either of the signals, and supplies the selected one to the m-th external output terminal EXTm' of the integrated circuit.

The (m+1)th to k-th selectors Sm+1' to Sk' receive signals as the results of a function test output from the output terminals OUTm to OUTn of the function macro 1, and a signal output from a circuit of the integrated circuit other than the function macro 1 in normal operation. The selectors Sm+1' to Sk' select any of these signals, and supply the selected signals to the (m+1)th to k-th external output terminals EXTm+1' to EXTk' of the integrated circuit.

When the results of a function test using a certain test pattern signal are output as fixed values, test results output from the output terminals OUTm to OUTn of the function macro 1 are compared by the comparators Cm to Cn, performed AND operation of them by the AND gate 5, and output to the external output terminal EXTm'. When the results of a function test are output as signals whose logic levels vary, test results output from the output terminals OUTm to OUTn of the function macro 1 are output outside from the external output terminal EXTm+1' to EXTk', and the test results are determined outside the integrated circuit.

The external output terminals EXTm+1' to EXTk' except for the specific external output terminal EXTm' of the integrated circuit are shared such that one external output terminal is shared by output terminals of the function macro 1 so long as one external output terminal does not simultaneously use test result signals output from the output terminals OUTm to OUTn of the function macro 1. In the embodiment of FIG. 16, the two output terminals OUTn−1 and OUTn of the function macro 1 share one external output terminal EXTk'.

In the eighth embodiment, the comparators Cm to Cn for selectively inputting, as a comparative reference, an expectation signal whose logic level is fixed to "H" or "L" are connected to the output side of the function macro 1. The selectors Sm to Sn for selecting the expectation signal, and the comparators Cm to Cn are controlled with control information in the test control register 2. When an expectation upon a test using a specific test pattern signal has fixed logic, AND operation of comparison results from the comparators Cm to Cn connected to the output terminals OUTm to OUTn of the function macro 1 is performed by the AND gate 5, and the result is output to one external output terminal EXTm'.

Of the external output terminals EXT0' to EXTk' of the integrated circuit, the external output terminals EXTm' to EXTk' except for the external output terminal EXTm' to which an output signal from the AND gate 5 is selectively supplied are shared such that one external output terminal is shared by output terminals of the function macro 1 so long as one external output terminal does not simultaneously use test result signals output from the output terminals OUTm to OUTn of the function macro 1.

The external output terminals EXT0' to EXTk' for outputting test result signals in the function macro 1 need not be equal in number to the output terminals OUT0 to OUTn of the function macro 1 (k<n). The number of external output terminals necessary for a function test can be reduced. Since a fixed-logic expectation signal to be compared is generated inside the integrated circuit, the integrated circuit does not require any external input terminal for inputting such fixed-logic signal. This can suppress an increase in the number of terminals.

In the eighth embodiment, the selectors Sm to Sn and Sm' to Sk' provided on the output side of the function macro 1 are controlled in accordance with control information set in the test control register 2. The control information in the test control register 2 is set using the common bus of the integrated circuit. The integrated circuit does not require any special terminal for writing control information in the test control register 2 from outside the integrated circuit. This can suppress an increase in the number of external input terminals. Control information suffices to be written in the test control register 2 in accordance with a transaction defined in advance, and no special procedures need be newly prepared. The merit of using the common bus is attained similarly in the following embodiments.

Ninth Embodiment

Figure 17:
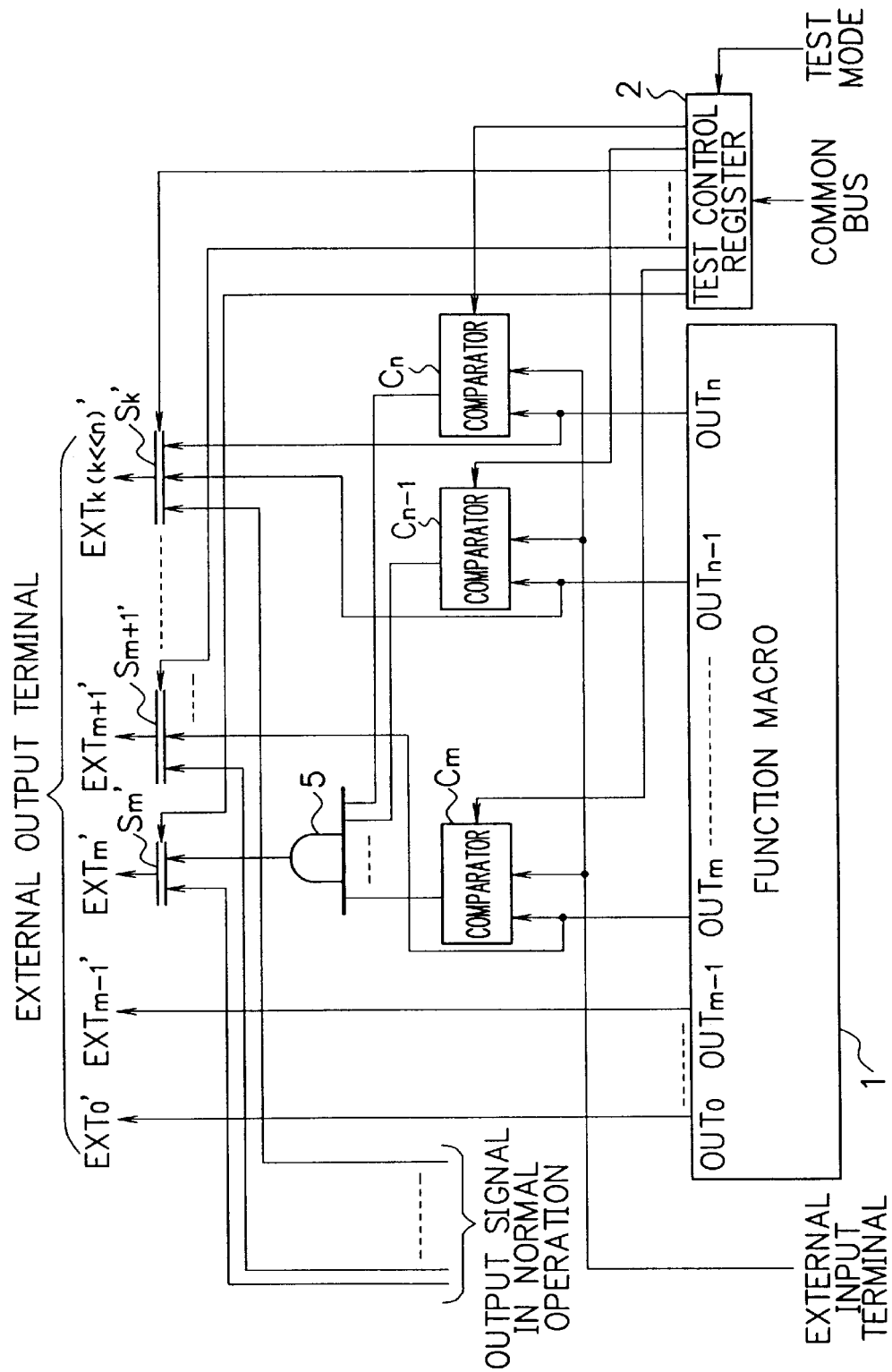
FIG. 17 is a circuit diagram showing a fundamental construction of the ninth embodiment of the present invention for running a function test on a function macro.

FIG. 17 is a circuit diagram showing a fundamental construction of the ninth embodiment for running a function test on a function macro. In the ninth embodiment shown in FIG. 17, as well as the eighth embodiment, of output terminals OUT0 to OUTn of a function macro 1, the zeroth to (m−1)th output terminals OUT0 to OUTm−1 are directly connected to external output terminals EXT0' to EXTm−1' of an integrated circuit. Comparators Cm to Cn are so connected as to correspond respectively the m-th to n-th output terminals OUTm to OUTn.

Similarly to the eighth embodiment, selectors Sm' to Sk' are so provided as to correspond respectively to the m-th to k-th external output terminals EXTm' to EXTk' (k<n) of the integrated circuit. The m-th selector Sm' selects either of a signal output from an AND gate 5 for performing AND operation of test results output from the comparators Cm to Cn, and a signal output from a circuit of the integrated circuit other than the function macro 1 in normal operation. The selector Sm' supplies the selected signal to the m-th external output terminal EXTm' of the integrated circuit.

The (m+1)th to k-th selectors Sm+1' to Sk' receive signals as the results of a function test output from the output terminals OUTm to OUTn of the function macro 1, and a signal output from a circuit of the integrated circuit other than the function macro 1 in normal operation. The selectors Sm+1' to Sk' select any of these signals, and supply the selected signals to the (m+1)th to k-th external output terminals EXTm+1' to EXTk' of the integrated circuit.

The comparators Cm to Cn in the eighth embodiment compare test result signals output from the corresponding output terminals OUTm to OUTn of the function macro 1, with one expectation signal of a function test commonly input from one external input terminal of the integrated circuit. When these signals coincide with each other, the comparators Cm to Cn output "H" signals to the AND gate 5. The comparators Cm to Cn are controlled in accordance with control information supplied from a test control register 2.

When the output terminals OUTm to OUTn of the function macro 1 output identical signals as processing results after a function test run in the function macro 1 using a given test pattern signal, the comparators Cm to Cn compare the test result signals output from the output terminals OUTm to OUTn with one expectation signal input from the external input terminal, and output the comparison results to the AND gate 5. AND operation of the comparison results output from the comparators Cm to Cn is performed by the AND gate 5, and the result is selectively output to the external output terminal EXTm'.

When signals output from all or some of the output terminals OUTm to OUTn of the function macro 1 are different after a function test run in the function macro 1, test result signals output from output terminals exhibiting different signals are output outside from the external output terminals EXTm+1' to EXTk' to determine the test results outside the integrated circuit.

Also in the ninth embodiment, the external output terminals EXTm' to EXTk' except for the specific external output terminal EXTm' of the integrated circuit are shared such that one external output terminal is shared between output terminals of the function macro 1 so long as one external output terminal does not simultaneously use test result signals output from the output terminals OUTm to OUTn of the function macro 1. In the embodiment of FIG. 17, the two output terminals OUTn-1 and OUTn of the function macro 1 share one external output terminal EXTk'.

In the ninth embodiment, the comparators Cm to Cn for inputting a common signal as an expectation signal serving as a comparison reference to the output terminals OUTm to OUTn of the function macro 1 are connected to the output side of the function macro 1. These comparators Cm to Cn are controlled by control information in the test control register 2. If expectation signals upon a test using a specific test pattern signal are identical between the output terminals OUTm to OUTn of the function macro 1, AND operation of the comparison results of the comparators Cm to Cn connected to the output terminals OUTm to OUTn is performed by the AND gate 5, and the result is output to one external output terminal EXTm'.

Of the external output terminals EXT0' to EXTk' of the integrated circuit, the external output terminals EXTm+1' to EXTk' except for the external output terminal EXTm' to which an output signal from the AND gate 5 is selectively supplied, are shared such that one external output terminal is shared by output terminals of the function macro 1 so long as one external output terminal does not simultaneously use test result signals output from the output terminals OUTm to OUTn of the function macro 1.

The external output terminals EXT0' to EXTk' for outputting test result signals in the function macro 1 need not be equal in number to the output terminals OUT0 to OUTn of the function macro 1 (k<n). The number of external output terminals necessary for a function test can be decreased. One expectation signal input from one external input terminal of the integrated circuit is commonly input to output terminals of the function macro 1. The integrated circuit does not require many external input terminals for inputting expectation signals of the same logic level. An increase in the number of terminals can be suppressed.

In the ninth embodiment, a common expectation signal input to the comparators Cm to Cn may be identical to a reset signal. In some cases, the expectation of an output terminal whose output is not subjected to a function test based on a specific test pattern signal among the output terminals OUT0 to OUTn of the function macro 1 may be closely related to the logic level of the reset terminal. In this case, a reset signal is commonly supplied as a reference to a comparator corresponding to the output terminal. This eliminates any external input terminal for inputting particularly an expectation signal, and can suppress an increase in the number of terminals.

Tenth Embodiment

Figure 18:
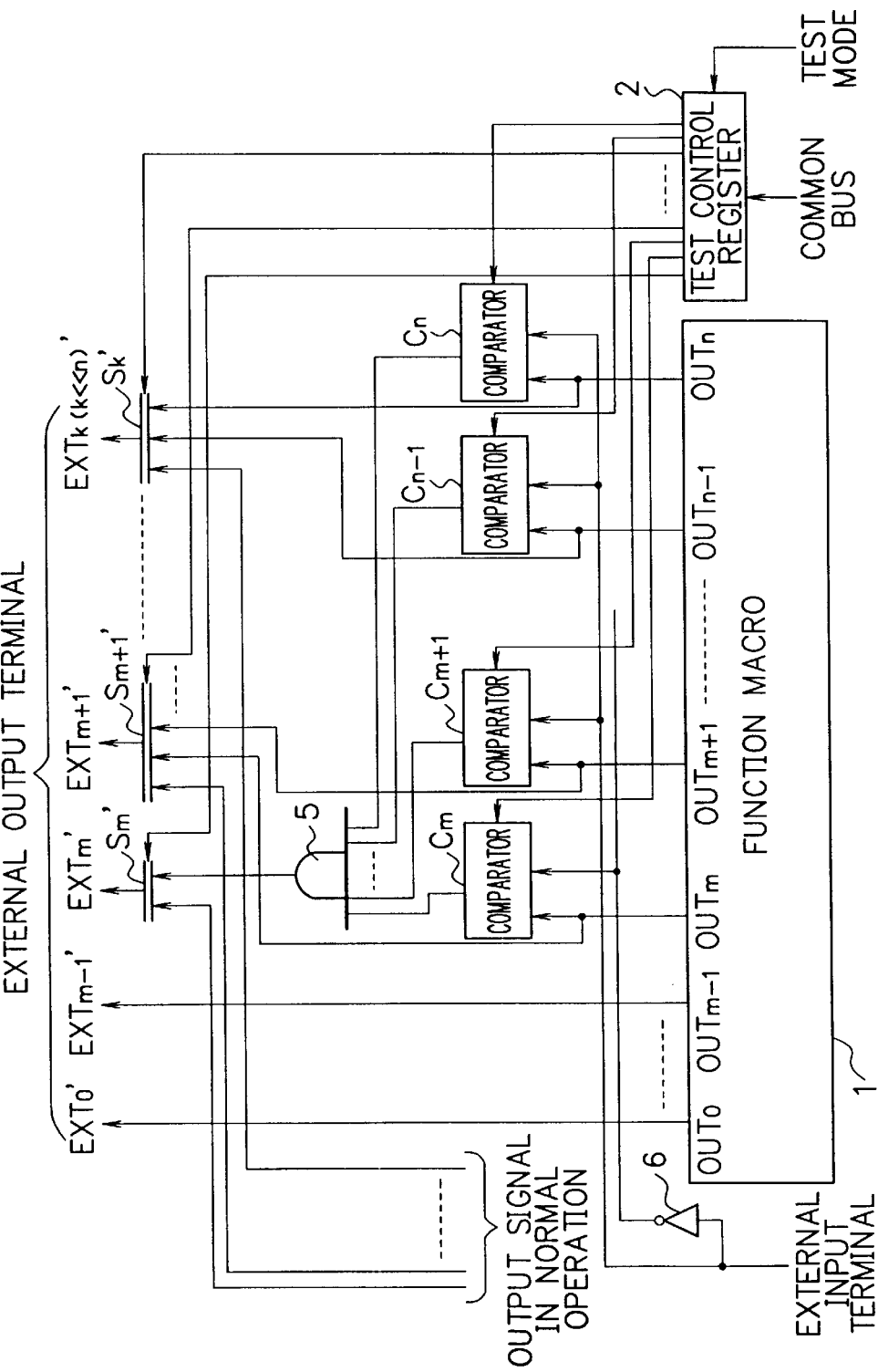
FIG. 18 is a circuit diagram showing a fundamental construction of the tenth embodiment of the present invention for running a function test on a function macro.

FIG. 18 is a circuit diagram showing a fundamental construction of the tenth embodiment for running a function test on a function macro. In the tenth embodiment, when two or more signals as the results of a function test are opposite logic signals, only one signal is input as an expectation signal from the external input terminal of an integrated circuit to each comparator. The other expectation signal of opposite logic is generated from the input signal by an inverter 6 inside the integrated circuit.

In the embodiment shown in FIG. 18, a common expectation signal input from the external input terminal of the integrated circuit is supplied to (m+1)th to n-th comparators Cm+1 to Cn. The input expectation signal is supplied to the inverter 6 to generate an expectation signal of opposite logic, which is supplied to an m-th comparator Cm. The remaining construction is the same as in the ninth embodiment shown in FIG. 17, and a repetitive description thereof will be omitted.

In the tenth embodiment, when two or more expectation signals as the results of a function test are opposite logic signals, only one expectation signal is input from the external input terminal. The other expectation signal of opposite logic is generated from the input signal inside the integrated circuit. These expectation signals are supplied to the comparators Cm to Cn. Similarly to the eighth and ninth embodiments, AND operation of the comparison results of the comparators Cm to Cn is performed by an AND gate 5, and the result is selectively output to one external output terminal EXTm'.

External output terminals EXT0' to EXTk' for outputting test result signals in a function macro 1 need not be equal in number to output terminals OUT0 to OUTn of the function macro 1 (k<n). The number of external output terminals necessary for a function test can be decreased. An expectation signal of opposite logic is generated inside the integrated circuit from an expectation signal input from the external input terminal. The integrated circuit does not require many external input terminals for inputting expectation signals of opposite logic levels. An increase in the number of terminals can be suppressed.

Also in the tenth embodiment, an expectation signal input from the external input terminal may be identical to a reset signal.

Eleventh Embodiment

Figure 19:
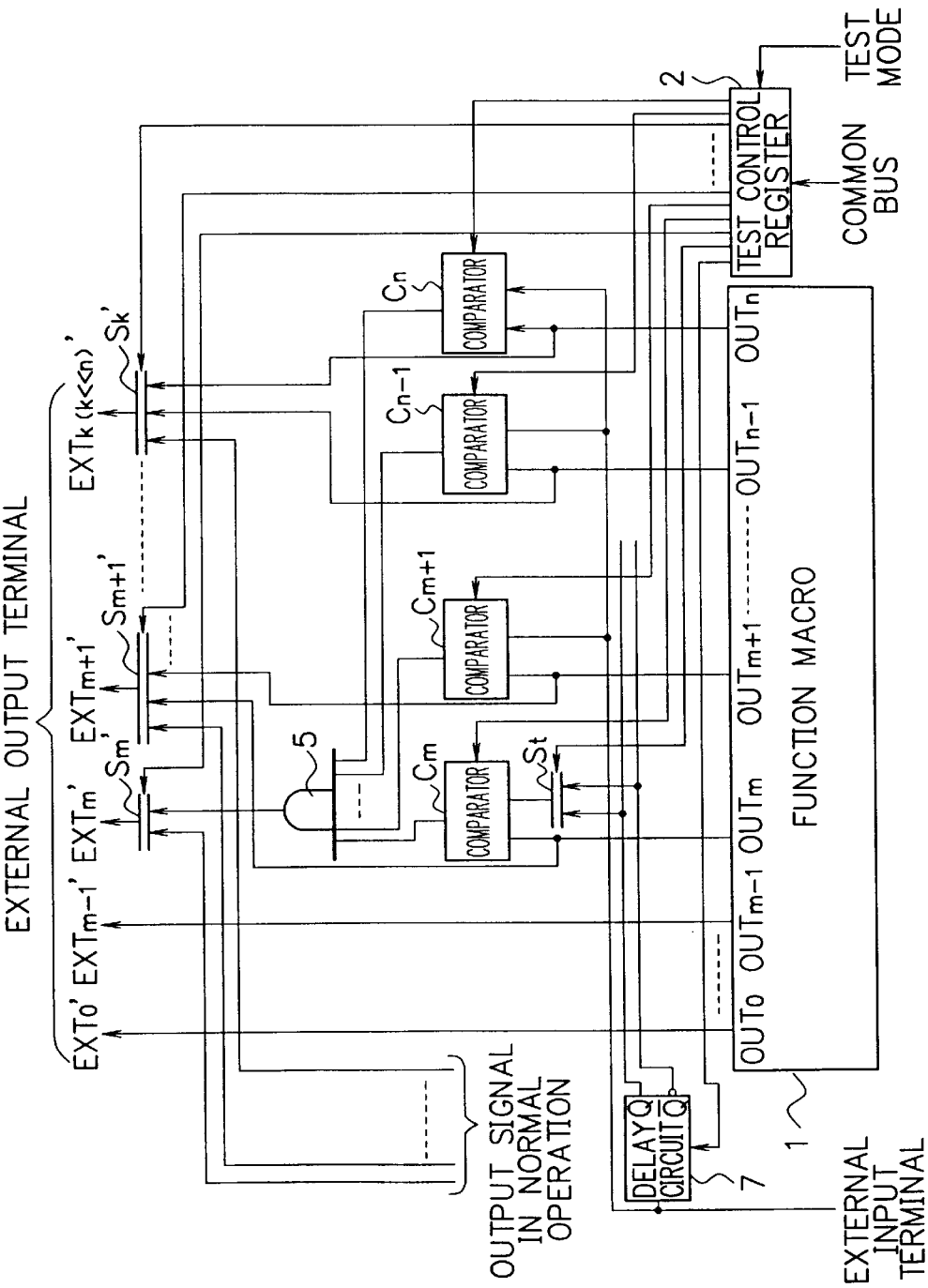
FIG. 19 is a circuit diagram showing a fundamental construction of the eleventh embodiment for running a function test on a function macro.

FIG. 19 is a circuit diagram showing a fundamental construction of the eleventh embodiment for running a function test on a function macro. In the eleventh embodiment, when, of two signals as the results of a function test, the other signal is a signal delayed from one signal by a predetermined number of clocks or is an opposite logic signal, only one signal is input as an expectation signal from the external input terminal of an integrated circuit to each comparator. The expectation signal delayed by a predetermined number of clocks or the expectation signal of opposite logic is generated from the input signal by a delay circuit 7 inside the integrated circuit.

In the embodiment shown in FIG. 19, a common expectation signal input from the external input terminal of the integrated circuit is supplied to (m+1)th to n-th comparators Cm+1 to Cn. The input expectation signal is supplied to the delay circuit 7 to generate an expectation signal delayed by a predetermined number of clocks and an expectation signal of opposite logic. A selector St selects either of the expectation signal delayed by a predetermined number of clocks that is output from the Q terminal of the delay circuit 7, and the expectation signal of opposite logic output from its $\overline{Q}$ terminal. The expectation signal selected by the selector St is supplied to an m-th comparator Cm.

The selection state in the selector St is controlled in accordance with control information supplied from a test control register 2. The delay amount or the predetermined number of clocks in the delay circuit 7 is also adjusted in accordance with control information supplied from the test control register 2. The remaining construction is the same as in the ninth embodiment shown in FIG. 17, and a repetitive description thereof will be omitted.

In the eleventh embodiment, when a certain expectation signal as the result of a function test is a signal delayed from one expectation signal by a predetermined number of clocks or is an opposite logic signal, only one expectation signal is input from the external input terminal. The expectation signal delayed by a predetermined number of clocks or the expectation signal of opposite logic is generated inside the integrated circuit from the expectation signal input from the external input terminal. Similarly to the eighth and ninth embodiments, these expectation signals are supplied to the comparators Cm to Cn. AND operation of the comparison results of the comparators Cm to Cn is performed by an AND gate 5, and the result is selectively output to one external output terminal EXTm'.

External output terminals EXT0' to EXTk' for outputting test result signals in a function macro 1 need not be equal in number to output terminals OUT0 to OUTn of the function macro 1 (k<n). The number of external output terminals necessary for a function test can be decreased. An expectation signal delayed by a predetermined amount from an expectation signal input from the external input terminal or an expectation signal of opposite logic is generated inside the integrated circuit. The integrated circuit does not require many external input terminals for inputting an expectation signal and an expectation signal delayed by a predetermined amount. An increase in the number of terminals can be suppressed.

The delay circuit 7 in the eleventh embodiment can also be constituted as shown in FIG. 12A. The delay circuit 7 having this construction can generate, from an original signal input to the delay circuit 7, an expectation signal whose leading and trailing edge timings are delayed by different amounts.

Also in the eleventh embodiment, an expectation signal input from the external input terminal may be identical to a reset signal.

Twelfth Embodiment

Figure 20:
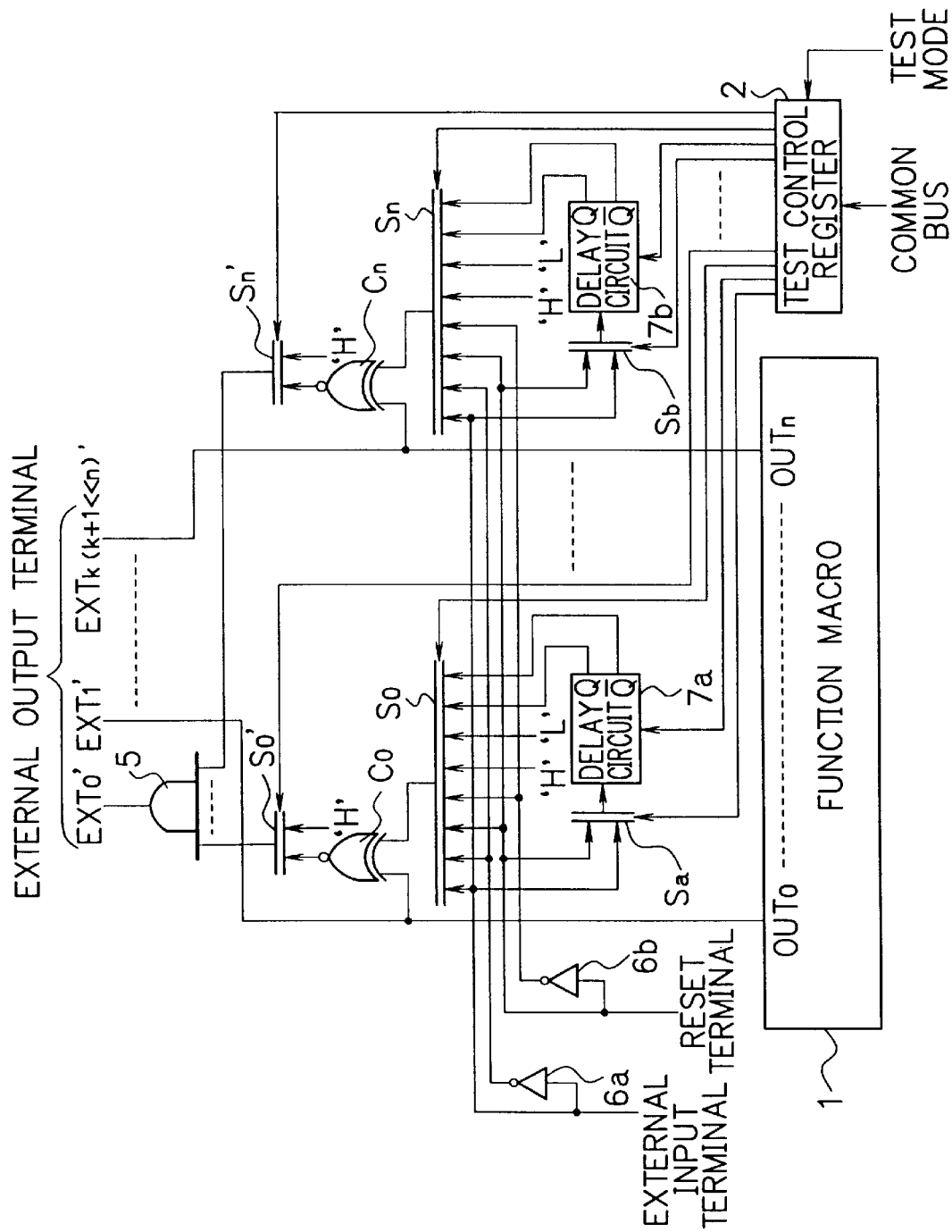
FIG. 20 is a circuit diagram showing a fundamental construction of the twelfth embodiment of the present invention for running a function test on a function macro.

FIG. 20 is a circuit diagram showing a fundamental construction of the twelfth embodiment for running a function test on a function macro. The twelfth embodiment shown in FIG. 20 is a combination of all the eighth to eleventh embodiments.

In the embodiment shown in FIG. 20, output terminals OUT0 to OUTn of a function macro 1 are connected to external output terminals EXT1' to EXTk' in order to determine the results of a function test outside an integrated circuit, and to one input terminal side of comparators C0 to Cn in order to determine the results of a function test inside the integrated circuit. The other input terminal side of the comparators C0 to Cn is connected to the output side of selectors S0 to Sn.

For example, the zeroth selector S0 receives an expectation signal as a test result input from an external input terminal, an expectation signal whose logic is inverted by an inverter 6a, a reset signal input from a reset terminal, a signal whose logic is inverted by an inverter 6b, a signal obtained by delaying either (selected by the selector Sa) of the signals input from the external input terminal and reset terminal by a delay circuit 7a by a predetermined number of clocks and an opposite logic signal, and "H" and "L" fixed-logic expectation signals. The selector S0 selects one of these signals in accordance with control information supplied from a test control register 2.

The n-th selector Sn receives an expectation signal as a test result input from the external input terminal, an expectation signal whose logic is inverted by the inverter 6a, a reset signal input from the reset terminal, a signal whose logic is inverted by the inverter 6b, a signal obtained by delaying either (selected by the selector Sb) of the signals input from the external input terminal and reset terminal by a delay circuit 7b by a predetermined number of clocks and an opposite logic signal, and "H" and "L" fixed-logic expectation signals. The selector Sn selects one of these signals in accordance with control information supplied from the test control register 2.

The comparators C0 to Cn compare test result signals output from the output terminals OUTm to OUTn of the function macro 1 with expectation signals selected by the selectors S0 to Sn in accordance with a target test pattern, and output to selectors S0' to S1' comparison results representing whether these signals coincide with each other. The selectors S0' to Sn' select any of the comparison result signals output from the comparators C0 to Cn and "H" fixed-logic signals, and output the selected signals to an AND gate 5.

The selectors S0' to Sn' switch the selection states of input signals in accordance with control information supplied from the test control register 2. More specifically, when test result signals output from the output terminals OUT0 to OUTn of the function macro 1 are output from the external output terminals EXT1' to EXTk' to determine the signals outside the integrated circuit, the selectors S0' to Sn' select "H" fixed-logic signals. When test results output from the output terminals OUT0 to OUTn of the function macro 1 are determined inside the integrated circuit using the comparators Cm to Cn and the AND gate 5, the selectors S0' to Sn' select outputs from the comparators Cm to Cn, and supply the selected signals to the AND gate 5.

The AND gate 5 performs AND operation of the signals supplied from the selectors S0' to Sn' to see if the results of a function test in the function macro 1 coincide with expectations at all the output terminals OUT0 to OUTn. The result is output from the zeroth external output terminal EXT0' of the integrated circuit.

Also in the twelfth embodiment having this construction, the external output terminals EXT0' to EXTk' for outputting test result signals in the function macro 1 need not be equal in number to the output terminals OUT0 to OUTn of the function macro 1 (k<n). The number of external output terminals necessary for a function test can be decreased. In the twelfth embodiment, a larger number of external output terminals can be shared between output terminals of the function macro 1. Thus, the number of external output terminals can be reduced in comparison with to a case in which the eighth to eleventh embodiments are independently applied.

Thirteenth Embodiment

Figure 21:
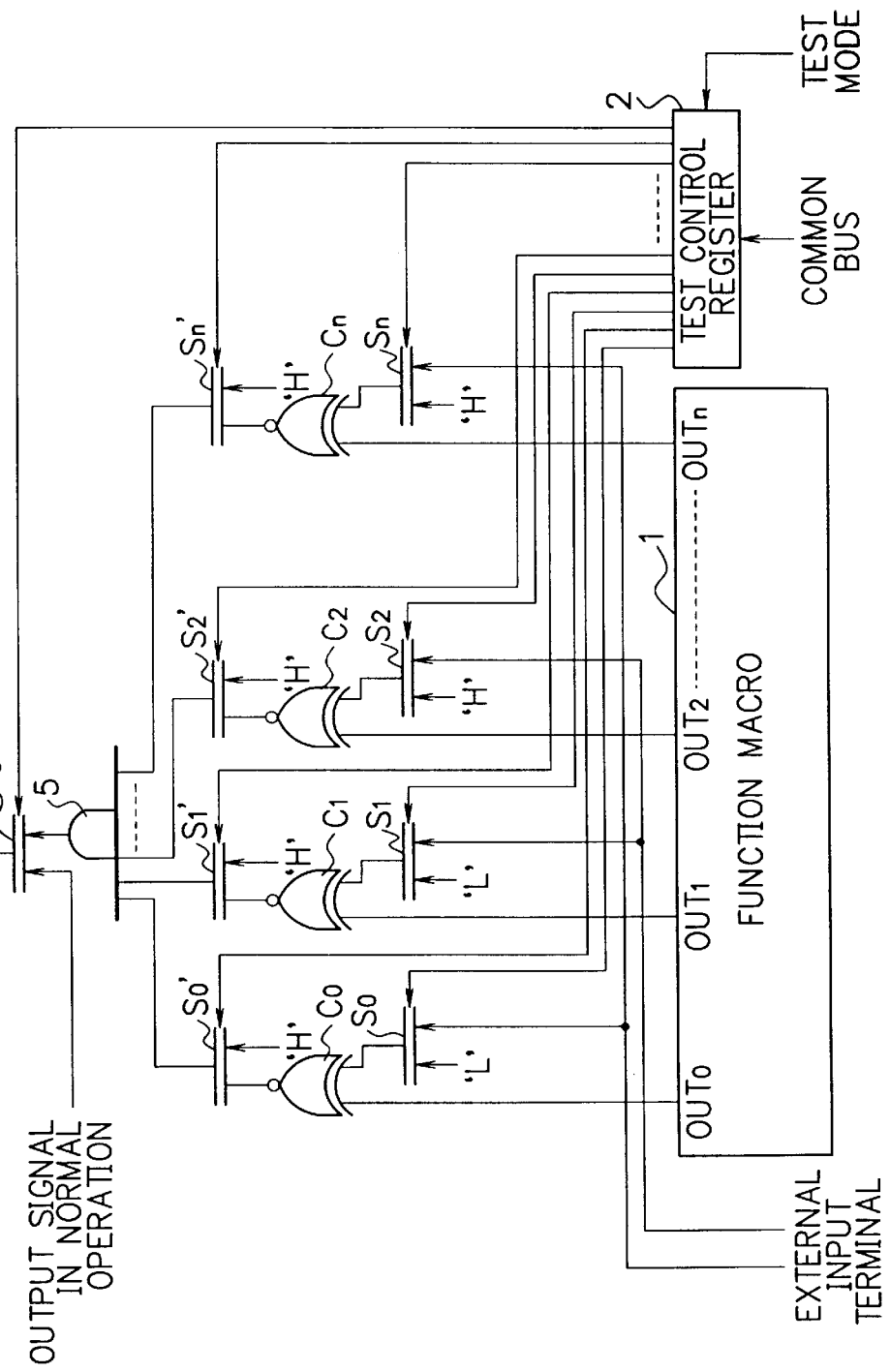
FIG. 21 is a circuit diagram showing a fundamental construction of the thirteenth embodiment of the present invention for running a function test on a function macro.

FIG. 21 is a circuit diagram showing a fundamental construction of the thirteenth embodiment for running a function test on a function macro. The twelfth embodiment shown in FIG. 20 can greatly reduce the number of external output terminals. However, the size of the selectors S0 to Sn increases, and the amount of control information in the test control register 2 for controlling the selection states of the selectors S0 to Sn increases.

To the contrary, the thirteenth embodiment shown in FIG. 21 inputs a minimum number of expectation signals to selectors S0 to Sn connected to the reference side of comparators C0 to Cn on which the expectation signals are compared with output signals from a function macro 1. This can suppress an excessive increase in the size of the selectors S0 to Sn, and can reduce the amount of control information in a test control register 2 for controlling the selection states of the selectors S0 to Sn.

The thirteenth embodiment shown in FIG. 21 corresponds to a combination of the eighth and ninth embodiments. That is, the selectors S0 to Sn select any of "H" or "L"-fixed expectation signals and a common expectation signal input from the external input terminal, and supply the selected signals to the comparators C0 to Cn. The thirteenth embodiment is a combination of the eighth and ninth embodiments, but the combination of embodiments is not limited to this.

In the thirteenth embodiment shown in FIG. 21, as well as the seventh embodiment shown in FIG. 15, the selectors S0 to Sn select signals to be used from expectation signals, and test results in the function macro 1 are determined inside the integrated circuit using the comparators C0 to Cn and an AND gate 5. A selector S on the output stage of the AND gate 5 selects either of the determination result of the function test and an output signal in normal operation, and outputs the selected signal from the external output terminal of the function macro 1.

Each of the selectors S0 to Sn arranged in this way selects two inputs. Control information in the test control register 2 for controlling the selection state can be one bit long for one selector. This can reduce the amount of control information and reduce the burden on the selectors S0 to Sn. When the number of expectation signals selectable by the selectors Sn0 to Sn is three or more, each selector receives three or more inputs.

Fourteenth Embodiment

Figure 22:
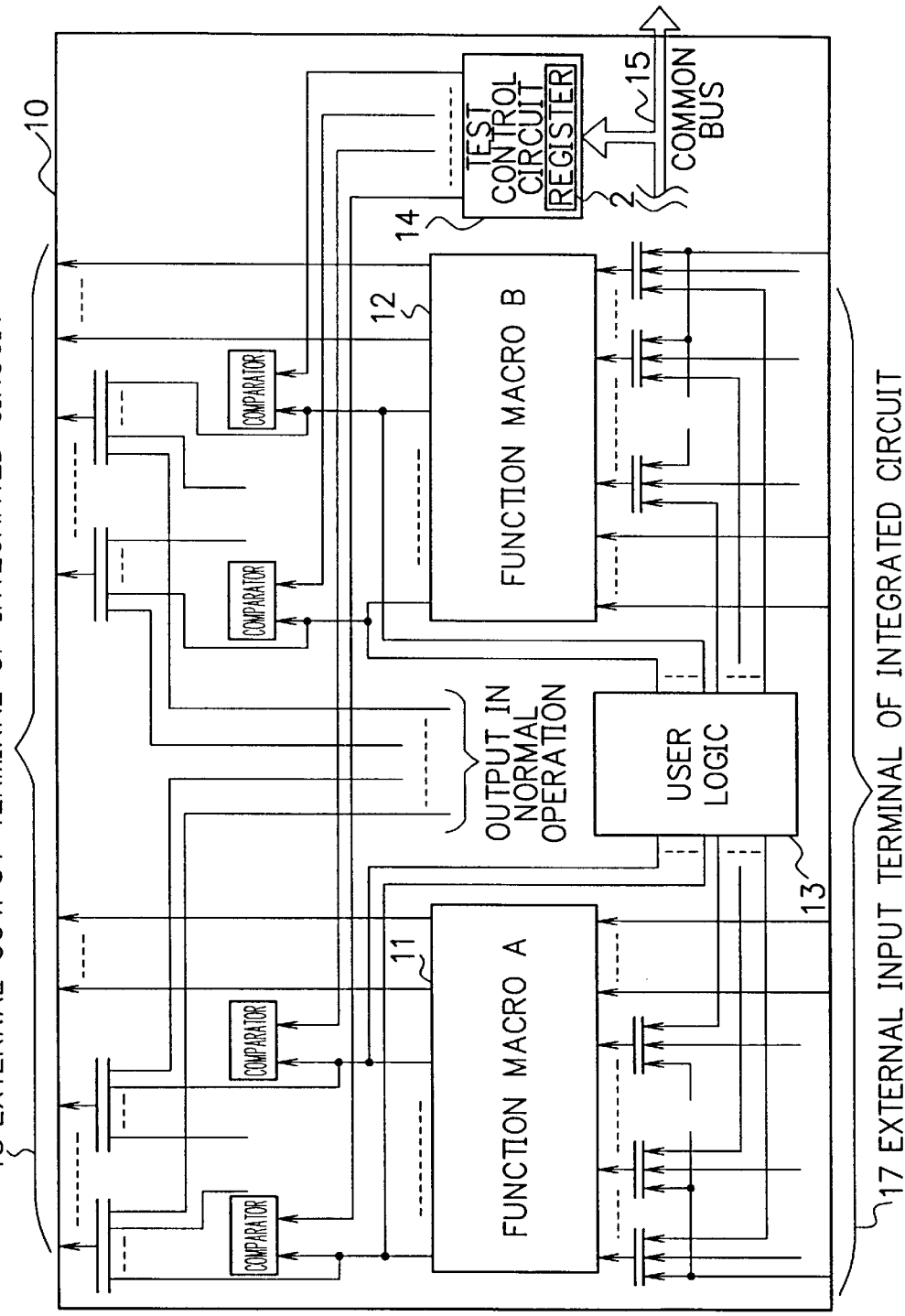
FIG. 22 is a circuit diagram showing an construction of the fourteenth embodiment of the present invention in which one integrated circuit includes two different function macros.

FIG. 22 is a circuit diagram showing a fundamental construction of the fourteenth embodiment for running a function test on a function macro. This embodiment will exemplify an construction when one integrated circuit includes function macros.

In the construction shown in FIG. 22, one integrated circuit 10 includes two function macros A and B (11 and 12) and another user logic 13, to which necessary signals are supplied from external input terminals 17 of the integrated circuit 10 to run a function test. At this time, the two function macros 11 and 12 are simultaneously selected to execute simultaneously function tests on the function macros 11 and 12. The test results in the function macros 11 and 12 are output from external output terminals 18 of the integrated circuit 10 to obtain the results of the function tests.

Although not shown in FIG. 22, the input sides of the function macros 11 and 12 and the user logic 13 are constructed similarly to any one of the first to seventh embodiments shown in FIGS. 4 to 15. That is, the respective external input terminals of the integrated circuit 10 are connected to the inputs of selectors on the input sides of the function macros 11 and 12 and the user logic 13. The control terminals of the selectors select input signals in accordance with control information supplied from a test control circuit 14. The input terminals of the function macros 11 and 12 include terminals always connected to the external input terminals of the integrated circuit, and terminals for receiving signals from the user logic 13 in normal operation, and receiving test pattern signals from the external input terminal or fixed-logic signals generated inside the integrated circuit in function test operation.

The output sides of the function macros 11 and 12 and the user logic 13 are constructed similarly to any one of the eighth to thirteenth embodiments shown in FIGS. 16 to 21. That is, the respective external output terminals of the integrated circuit 10 are connected to the outputs of selectors on the output sides of the function macros 11 and 12 and the user logic 13. The operation of determining test results is controlled in accordance with control information supplied from the test control circuit 14 to the selectors and the control terminals of comparators. The output terminals of the function macros 11 and 12 include terminals always connected to the external output terminals of the integrated circuit, and terminals which are connected to the user logic 13 in normal operation, and to a specific external output terminal via the comparators and an AND gate or to other external output terminals in function test operation.

Procedures when the present invention is applied to the integrated circuit including the two function macros 11 and 12 will be explained.

In a test of determining the qualities of the function macros 11 and 12 integrated in the integrated circuit, it is examined whether the input/output terminals of the function macros 11 and 12 are terminals whose input/output signals are always fixed to "H" or "L" for each test pattern, a terminal group in which input/output signals are identical between terminals, terminals for inputting/outputting signals opposite in logic to signals from the terminal group, terminals for inputting/outputting signals whose leading edge timings always change with a predetermined delay, or terminals for inputting/outputting signals whose trailing edge timings always change with a predetermined delay. From the examination results and the number of usable external input/output terminals of the integrated circuit, constructions to be applied to the input and output sides of the function macros 11 and 12 are selected from the constructions in the first to thirteenth embodiments. For example, embodiments with simpler constructions are selected.

Based on the examination results, a combination of terminals which do not simultaneously use one external terminal of the integrated circuit is selected from the input/output terminals (to be referred to as macro terminals hereinafter) of the function macros 11 and 12. A signal necessary for the input of the corresponding selector and a method of controlling the selector and the comparator are determined for each macro terminal. By resetting the test control circuit 14 (test control register 2), the input sides of the function macros 11 and 12 select input signals in normal operation so as not to output, to outside the integrated circuit, a signal obtained by performing AND operation of outputs from the comparators by the AND gate.

The number of clocks (the lengths of test patterns FN00 to FN03) necessary for a test is determined. A combination of test patterns simultaneously tested in the function macros 11 and 12 is selected in consideration of the test pattern length, the number of common terminals to be used, and the like. For a test pattern using many clocks in one function macro, some test patterns using the same control information set in the test control register 2 of the test control circuit 14 are selected from test patterns for the other function macro. The selected test patterns are concatenated to adjust the total test pattern length.

A test pattern for a parallel test using a decreased number of external input/output terminals is created based on the combination of selected test patterns for the function macros 11 and 12. Functions for setting a method of inputting signals to the input terminals of the function macros 11 and 12, and a method of determining signals output from the output terminals of the function macros 11 and 12, i.e., control information sequences set for the respective edge patterns FN00, FN01, . . . are created in the test control register 2 of the test control circuit 14. At this time, control information is written in the test control register 2 via a common bus 15 connected to the function macro 11 or 12.

In creating the control information sequences, the second and subsequent test patterns FN01, . . . can be created only by changing some or all of data set in the test control register 2.

The created parallel test pattern is added to the created functions. The resultant test pattern undergoes simulation to complete a series of function tests.

In these procedures, the number of terminals is not reduced in low bits of an address bus or a data bus which are difficult to share other terminals. Further, the two function macros 11 and 12 do not share a terminal. Accordingly, a parallel test pattern for the two function macros 11 and 12 can be created with relatively simple procedures.

As described above, the fourteenth embodiment can simultaneously run function tests on the function macros 11 and 12 to shorten the test time, and can reduce the number of external terminals of the integrated circuit 10 necessary for a test to reduce the cost.

The above-described embodiments are merely examples of the present invention, and the technical scope of the present invention must not be constructed to be restricted to them. The present invention can be variously modified within the spirit and scope of the present invention.

What is claimed is:

1. An integrated circuit test apparatus for testing a function macro integrated in an integrated circuit, wherein
a fixed-logic signal generated inside said integrated circuit is selectively supplied to an input terminal of the function macro for receiving a signal whose logic is fixed on at least one test pattern.

2. An apparatus according to claim 1, wherein an external input terminal of said integrated circuit for receiving a variable-logic signal is shared by input terminals of said function macro including terminals which do not simultaneously use one external input terminal as far as a signal input from said external input terminal is not simultaneously used by at least two input terminals of said function macro.

3. An apparatus according to claim 1, wherein a selection state of a signal input to said input terminal of said function macro is controlled in accordance with control information set in a register.

4. An apparatus according to claim 3, wherein said control information is set in said register via a common bus also connected to said function macro.

5. An integrated circuit test apparatus for testing a function macro integrated in an integrated circuit, wherein
a signal input from a specific external input terminal of said integrated circuit is selectively supplied to input terminals of the function macro for receiving signals of the same logic level on at least one test pattern.

6. An integrated circuit test apparatus for testing a function macro integrated in an integrated circuit, wherein
to an input terminal of the function macro for receiving a signal opposite in logic level to one signal on at least one test pattern, the opposite logic signal is generated from said one signal inside said integrated circuit, and selectively supplied.

7. An integrated circuit test apparatus for testing a function macro integrated in an integrated circuit, wherein
to an input terminal of the function macro for receiving a signal delayed from one signal by a predetermined amount or an opposite logic signal on at least one test pattern, the signal delayed by the predetermined amount or the opposite logic signal is generated from said one signal inside said integrated circuit, and selectively supplied.

8. An apparatus according to claim 7, wherein leading and trailing edge delay amounts for said one signal input from said specific external input terminal are independently set.

9. An apparatus according to claim 7, wherein the amount is adjusted based on control information supplied from a test control register.

10. An integrated circuit test apparatus for testing a function macro integrated in an integrated circuit, comprising:
a signal generation circuit for generating a fixed-logic signal on at least one test pattern, or a signal having a specific relationship with a signal input from a specific external input terminal of said integrated circuit; and
a selection circuit for selectively supplying the signal generated by said signal generation circuit to an input terminal of said function macro.

11. An apparatus according to claim 10, wherein said selection circuit selectively supplies the signal input from a specific external input terminal of said integrated circuit, to input terminals of the function macro for receiving signals of the same logic level on at least one test pattern.

12. An integrated circuit test apparatus for testing a function macro integrated in an integrated circuit, wherein
a test result is determined for each signal output from at least one output terminal of said function macro by comparing a fixed-logic signal output from an output terminal of said function macro on at least one test pattern with a fixed-logic expectation signal generated inside said integrated circuit, and determination results are summed up and selectively supplied to a specific external output terminal of said integrated circuit.

13. An apparatus according to claim 12, wherein an external output terminal of said integrated circuit except for said specific external output terminal is shared by output terminals of said function macro as far as signals output from said output terminals of said function macro are not simultaneously used by one external output terminal.

14. An apparatus according to claim 12, wherein determination of the test result for each signal output from said output terminal of said function macro is controlled in accordance with control information set in a register.

15. An apparatus according to claim 14, wherein said control information is set in said register via a common bus also connected to said function macro.

16. An integrated circuit test apparatus for testing a function macro integrated in an integrated circuit, wherein
a test result is determined for each signal output from at least one output terminal of said function macro by comparing signals of the same logic level output from output terminals of said function macro on at least one test pattern with an expectation signal input from a specific external input terminal of said integrated circuit, and determination results are summed up and selectively supplied to a specific external output terminal of said integrated circuit.

17. An apparatus according to claim 16, further comprising:

a selection circuit for selecting a signal having a specific relationship with the expectation signal input from the external input terminal of the integrated circuit as the expectation signal input.

18. An integrated circuit test apparatus for testing a function macro integrated in an integrated circuit, wherein an expectation signal opposite in logic level to one expectation signal on at least one test pattern is generated from said one expectation signal inside said integrated circuit, and a test result is determined for each signal output from at least one output terminal of said function macro by comparing a signal output from an output terminal of said function macro with said one expectation signal and said expectation signal opposite in logic level to said one expectation signal, and determination results are summed up and selectively supplied to a specific external output terminal of said integrated circuit.

19. An apparatus according to claim 18, wherein said one expectation signal is a signal which is identical to a reset signal or opposite in logic level to said reset signal.

20. An integrated circuit test apparatus for testing a function macro integrated in an integrated circuit, wherein an expectation signal delayed from one expectation signal by a predetermined amount or an expectation signal of opposite logic on at least one test pattern is generated from said one expectation signal inside said integrated circuit, and a test result is determined for each signal output from at least one output terminal of said function macro by comparing a signal output from an output terminal of said function macro with said one expectation signal and said expectation signal delayed from said one expectation signal by a predetermined amount or said expectation signal of opposite logic, and determination results are summed up and selectively supplied to a specific external output terminal of said integrated circuit.

21. An apparatus according to claim 20, wherein leading and trailing edge delay amounts for said one expectation signal input from said specific external output terminal are independently set.

22. An integrated circuit test apparatus for testing a function macro integrated in an integrated circuit, comprising:

an internal determination circuit for comparing a signal output from an output terminal of said function macro with, as an expectation signal of a test, a fixed-logic signal or a signal having a specific relationship with a signal input from a specific external input terminal of said integrated circuit to determine a test result for each signal output from at least one output terminal of said function macro, summing up determination results, and selectively supplying the summed result to a specific external output terminal of said integrated circuit.

23. An apparatus according to claim 22, wherein an external output terminal of said integrated circuit except for said specific external output terminal is shared by output terminals of said function macro as far as signals output from said output terminals of said function macro are not simultaneously used by one external output terminal.

24. An integrated circuit test apparatus for testing a function macro integrated in an integrated circuit, comprising:

a first selection circuit for selecting a fixed-logic signal generated inside the integrated circuit;

a second selection circuit for selecting the selected fixed-logic signal and supplying to an input terminal of the function macro.

25. An apparatus according to claim 24, wherein the first selection circuit for selecting at least one of the fixed-logic signal and an external signal from an external input terminal of the integrated circuit.

26. An apparatus according to claim 24, wherein the second selection circuit for selecting at least one of the selected fixed-logic signal and an input signal in a normal operation.

27. A test method for testing a function macro integrated in an integrated circuit, comprising:

generating a fixed-logic signal inside in the integrated circuit; and supplying the fixed-logic signal to an input terminal of the function macro selectively as a signal, the fixed-logic signal having logic fixed on at least one test pattern.

28. A test method for testing a function macro integrated in an integrated circuit, comprising:

receiving a signal from a specific external input terminal of said integrated circuit; and selectively supplying said signal to input terminals of the function macro for receiving signals of the same logic level on at least one test pattern.

29. A test method for testing a function macro integrated in an integrated circuit, comprising:

generating an opposite logic signal inside said integrated circuit, the opposite logic signal opposite in logic level to one signal on at least one test pattern; and selectively applying said opposite logic signal to an input terminal of the function macro.

30. A test method for testing a function macro integrated in an integrated circuit, comprising:

generating a test signal from one signal inside said integrated circuit, said test signal either being delayed from one said signal by a predetermined amount or being an opposite logic signal on at least one test pattern; and selectively supplying said test signal to an input terminal of said function macro.

31. A test method for testing a function macro integrated in an integrated circuit, comprising:

generating either a fixed-logic signal on at least one test pattern, or a signal having a specific relationship with a signal input from a specific external input terminal of said integrated circuit; and selectively supplying the generated signal to an input terminal of said function macro.

32. A test method for testing a function macro integrated in an integrated circuit, comprising:

determining a test result for each signal output from at least one output terminal of said function macro by comparing a fixed-logic signal output from an output terminal of said function macro on at least one test pattern with a fixed-logic expectation signal generated inside said integrated circuit;

summing up determination results; and selectively supplying the summed determination results to a specific external output terminal of said integrated circuit.

33. A test method for testing a function macro integrated in an integrated circuit, comprising:

determining a test result for each signal output from at least one output terminal of said function macro by comparing signals of the same logic level output from output terminals of said function macro on at least one test pattern with an expectation signal input from a specific external input terminal of said integrated circuit;

summing up determination results; and selectively supplying the summed determination results to a specific external output terminal of said integrated circuit.

34. A test method for testing a function macro integrated in an integrated circuit, comprising:

generating an expectation signal from one expectation signal inside said integrated circuit, said generated expectation signal opposite in logic level to said one expectation signal on at least one test pattern;

determining a test result for each signal output from at least one output terminal of said function macro by comparing a signal output from an output terminal of said function macro with said one expectation signal and said generated expectation signal opposite in logic level to said one expectation signal;

summing up determination results; and selectively supplying the summed determination results to a specific external output terminal of said integrated circuit.

35. A test method for testing a function macro integrated in an integrated circuit, comprising:

generating an expectation signal from one expectation signal inside said integrated circuit, the generated expectation signal delayed from the one expectation signal by a predetermined amount or being an expectation signal of opposite logic on at least one test pattern;

determining a test result for each signal output from at least one output terminal of said function macro by comparing a signal output from an output terminal of said function macro with said one expectation signal and said generated expectation signal;

summing up determination results; and selectively supplying the summed determination results to a specific external output terminal of said integrated circuit.

36. A test method for testing a function macro integrated in an integrated circuit, comprising:

comparing a signal output from an output terminal of said function macro with, as an expectation signal of a test, a fixed-logic signal or a signal having a specific relationship with a signal input from a specific external input terminal of said integrated circuit to determine a test result for each signal output from at least one output terminal of said function macro;

summing up determination results; and selectively supplying the summed result to a specific external output terminal of said integrated circuit.

37. A test method for testing a function macro integrated in an integrated circuit, comprising:

selecting a fixed-logic signal generated inside the integrated circuit; and supplying the selected fixed-logic signal to an input terminal of the function macro.

* * * * *

UNITED STATES PATENT AND TRADEMARK OFFICE
CERTIFICATE OF CORRECTION

PATENT NO. : 6,785,857 B1
DATED : August 31, 2004
INVENTOR(S) : K. Ishikawa

It is certified that error appears in the above-identified patent and that said Letters Patent is hereby corrected as shown below:

Column 27,
Line 51, after "state of" delete "a" and insert -- the --.

Column 28,
Line 14, delete "said specific" and insert -- a specific --.
Line 30, after "from" delete "a" and insert -- the --.

Signed and Sealed this

Fourteenth Day of December, 2004

JON W. DUDAS
*Director of the United States Patent and Trademark Office*